United States Patent
Sawashima et al.

(10) Patent No.: US 10,297,476 B2
(45) Date of Patent: May 21, 2019

(54) SUBSTRATE PROCESSING APPARATUS

(71) Applicant: SCREEN Holdings Co., Ltd., Kyoto (JP)

(72) Inventors: Jun Sawashima, Kyoto (JP); Akito Hatano, Kyoto (JP); Kenji Kobayashi, Kyoto (JP); Yuta Nishimura, Kyoto (JP); Motoyuki Shimai, Kyoto (JP); Toyohide Hayashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 367 days.

(21) Appl. No.: 15/051,034

(22) Filed: Feb. 23, 2016

(65) Prior Publication Data

US 2016/0247697 A1 Aug. 25, 2016

(30) Foreign Application Priority Data

Feb. 25, 2015 (JP) .................................. 2015-35517
Feb. 25, 2015 (JP) .................................. 2015-35518

(51) Int. Cl.
  *H01L 21/67* (2006.01)
(52) U.S. Cl.
  CPC .... *H01L 21/6708* (2013.01); *H01L 21/67017* (2013.01); *H01L 21/67051* (2013.01)
(58) Field of Classification Search
  CPC ........... H01L 21/6708; H01L 21/67051; H01L 21/67017
  See application file for complete search history.

(56) References Cited

U.S. PATENT DOCUMENTS

| | | | |
|---|---|---|---|
| 5,626,913 A | 5/1997 | Tomoeda et al. | 427/299 |
| 6,566,275 B1 | 5/2003 | Moon | 438/745 |
| 2007/0289611 A1 | 12/2007 | Hayashi | 134/26 |
| 2009/0056746 A1* | 3/2009 | Sandhu | B08B 3/02 134/3 |
| 2009/0135381 A1 | 5/2009 | Kido | 355/27 |
| 2009/0229641 A1 | 9/2009 | Yoshida | 134/107 |
| 2010/0202867 A1 | 8/2010 | Hamada | 414/806 |
| 2010/0319734 A1* | 12/2010 | Minami | H01L 21/67051 134/26 |
| 2011/0079252 A1 | 4/2011 | Minamida et al. | 134/94.1 |
| 2012/0074102 A1 | 3/2012 | Magara et al. | 216/83 |
| 2013/0014787 A1 | 1/2013 | Urata et al. | 134/100.1 |
| 2013/0020284 A1* | 1/2013 | Osada | H01L 21/67028 216/57 |
| 2013/0048609 A1 | 2/2013 | Ito et al. | 216/83 |

(Continued)

FOREIGN PATENT DOCUMENTS

| | | |
|---|---|---|
| CN | 101093788 A | 12/2007 |
| CN | 102034730 A | 4/2011 |

(Continued)

*Primary Examiner* — Spencer E Bell
(74) *Attorney, Agent, or Firm* — Ostrolenk Faber LLP

(57) ABSTRACT

A supply flow passage branches into a plurality of upstream flow passages. A plurality of discharge ports are respectively disposed at a plurality of positions differing in distance from a rotational axis of a substrate. A return flow passage is connected to the upstream flow passage. A downstream heater heats liquid flowing through the upstream flow passage. A downstream switching unit supplies the liquid, supplied to the plurality of upstream flow passages from the supply flow passage, to one of the plurality of discharge ports and the return flow passage, selectively.

13 Claims, 9 Drawing Sheets

(56) References Cited

U.S. PATENT DOCUMENTS

| | | | |
|---|---|---|---|
| 2013/0057836 A1 | 3/2013 | Nakashima et al. | 355/27 |
| 2014/0041685 A1 | 2/2014 | Kaneko et al. | 134/4 |
| 2014/0231013 A1 | 8/2014 | Hinode et al. | 156/345.23 |
| 2015/0144595 A1 | 5/2015 | Inai et al. | 216/63 |
| 2016/0071746 A1 | 3/2016 | Hayashi | 438/16 |
| 2016/0240413 A1 | 8/2016 | Kobayashi et al. | 156/345.15 |

FOREIGN PATENT DOCUMENTS

| | | |
|---|---|---|
| CN | 105895560 A | 8/2016 |
| JP | H07-273015 A | 10/1995 |
| JP | H09-162097 A | 6/1997 |
| JP | H10-050603 A | 2/1998 |
| JP | H11-165114 A | 6/1999 |
| JP | 2005-186028 A | 7/2005 |
| JP | 2005-217226 A | 8/2005 |
| JP | 2006-344907 | 12/2006 |
| JP | 2009-218405 A | 9/2009 |
| JP | 2013-045972 A | 3/2013 |
| JP | 2014-013834 A | 1/2014 |
| JP | 2014-036205 A | 2/2014 |
| JP | 2014-197717 A | 10/2014 |
| JP | 2014-209605 A | 11/2014 |
| KR | 10-2012-0033250 A | 4/2012 |
| KR | 10-2014-0103072 A | 8/2014 |

\* cited by examiner

FIG. 1 Discharging state

FIG. 2 Discharge stoppage state

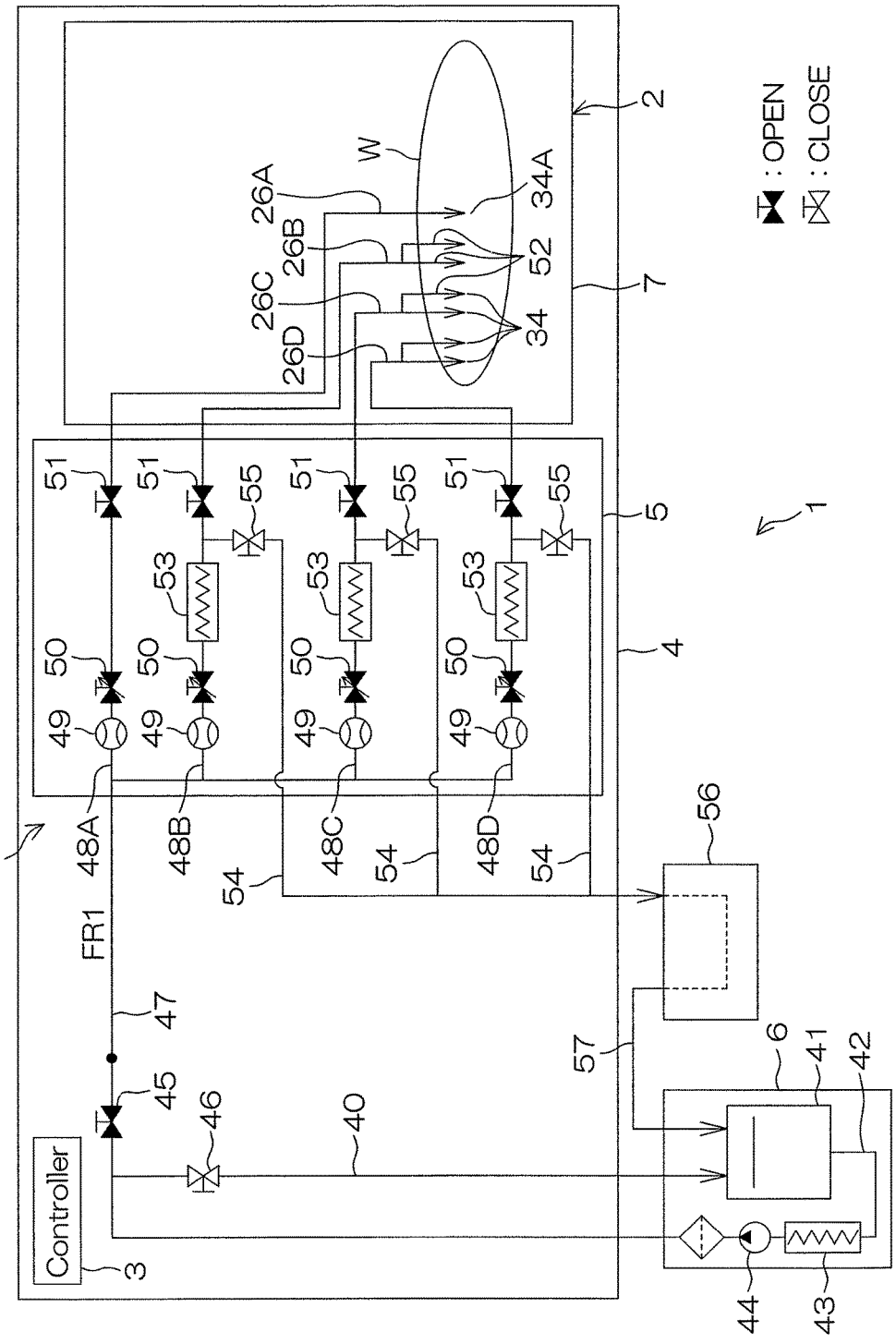
FIG. 12 Discharging state

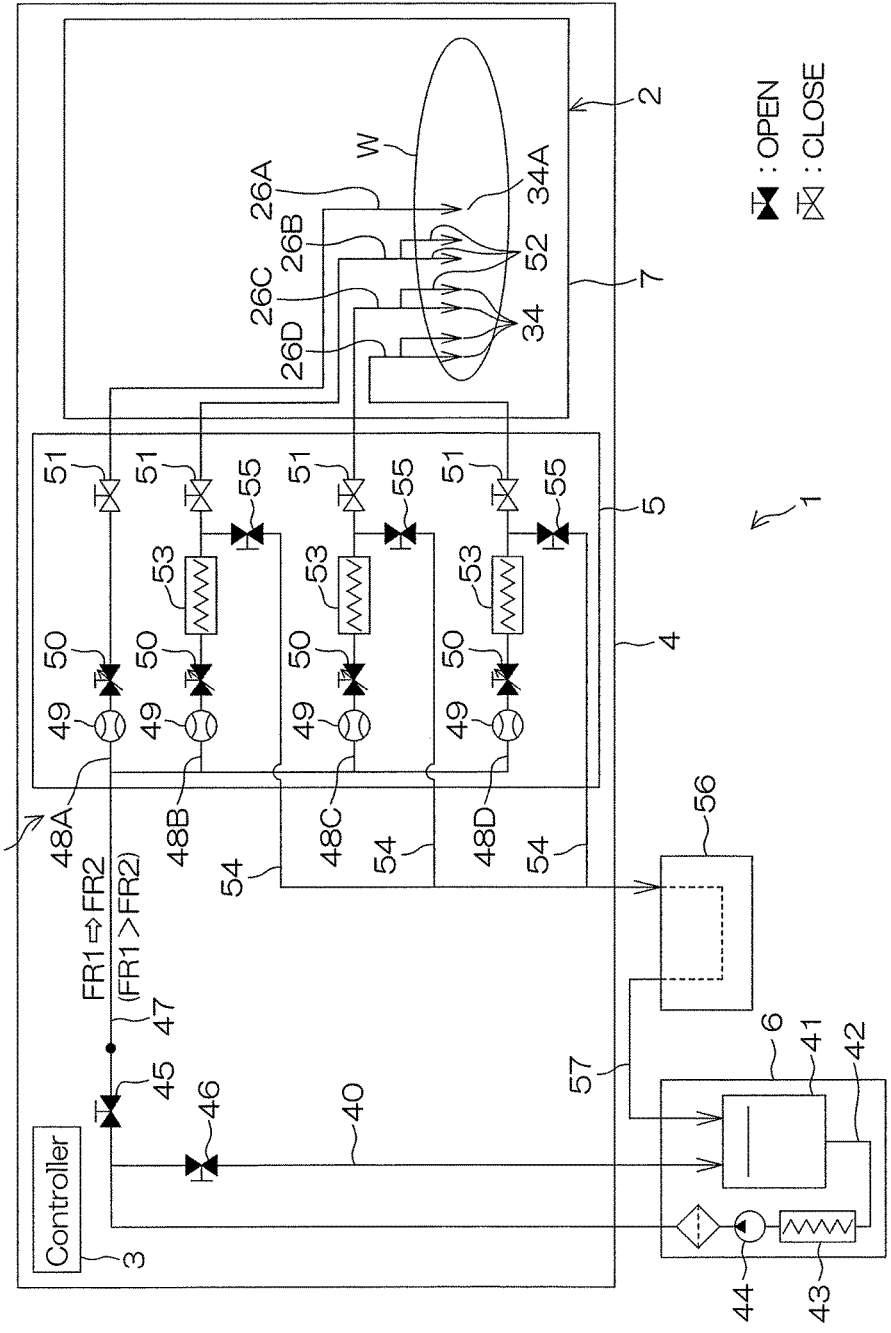
FIG. 13 Discharge stoppage state

SUBSTRATE PROCESSING APPARATUS

BACKGROUND OF THE INVENTION

1. Field of the Invention

The present invention relates to a substrate processing apparatus which processes a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

Japanese Patent Application Publication No. 2006-344907 discloses a single substrate processing type substrate processing apparatus that processes a substrate, such as a semiconductor wafer, etc., one by one. The substrate processing apparatus includes a spin chuck that rotates the substrate while holding the substrate horizontally and a nozzle that discharges a processing liquid of higher temperature than room temperature toward an upper surface central portion of the substrate held by the spin chuck. The high temperature processing liquid discharged from the nozzle lands on the upper surface central portion of the substrate and thereafter flows outward along the upper surface of the rotating substrate. The high temperature processing liquid is thereby supplied to an entire upper surface of the substrate.

The processing liquid that lands on the upper surface central portion of the rotating substrate flows from a central portion to a peripheral edge portion along the upper surface of the substrate. In this process, the temperature of the processing liquid decreases gradually. Temperature uniformity is thus decreased and processing uniformity is degraded. Although increasing a flow rate of the processing liquid discharged from the nozzle reduces the time taken for the processing liquid to reach the upper surface peripheral edge portion of the substrate and alleviates the lowering of the temperature of the processing liquid, in this case, the consumption amount of the processing liquid increases.

SUMMARY OF THE INVENTION

A preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes a supply flow passage, a plurality of upstream flow passages, a plurality of discharge ports, a plurality of return flow passages, a plurality of downstream heaters, and a downstream switching unit. The supply flow passage guides a liquid toward the plurality of upstream flow passages. The plurality of upstream flow passages branch from the supply flow passage and guide the liquid supplied from the supply flow passage toward the plurality of discharge ports. The plurality of discharge ports include a main discharge port discharging the processing liquid toward an upper surface central portion of the substrate and a plurality of auxiliary discharge ports discharging the processing liquid toward a plurality of positions within an upper surface of the substrate, the plurality of positions being away from the upper surface central portion and differing in distance from the rotational axis, and are respectively disposed at a plurality of positions differing in distance from the rotational axis, and respectively discharge the processing liquid supplied via the plurality of upstream flow passages toward the upper surface of the substrate held by the substrate holding unit. The plurality of upstream flow passages include a main upstream flow passage connected to the main discharge port and a plurality of auxiliary upstream flow passages connected to the plurality of auxiliary discharge ports. The plurality of return flow passages are respectively connected to the plurality of auxiliary upstream flow passages at positions further upstream than the plurality of auxiliary discharge ports. The plurality of downstream heaters are respectively connected to the plurality of auxiliary upstream flow passages at positions further upstream than a connection position between the return flow passage and the auxiliary upstream flow passage, and heat the liquids flowing through the plurality of auxiliary upstream flow passages. The downstream switching unit is switched into any one of a plurality of states including a discharge state in which the liquid, supplied to the plurality of upstream flow passages from the supply flow passage, is supplied to the plurality of discharge ports, and a discharge stoppage state in which the liquid, supplied to the plurality of upstream flow passages from the supply flow passage, is supplied to the plurality of return flow passage.

With this arrangement, the supply flow passage guiding the processing liquid branches into the plurality of upstream flow passages. The number of discharge ports can thereby be increased. The processing liquid flowing through the supply flow passage is supplied to the discharge ports via the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

In a case where processing liquids are discharged from a plurality of discharge ports toward a plurality of positions that are separated in a radial direction, it is important, in terms of improvement of processing uniformity, that processing liquids of the same quality are supplied to the respective portions of the substrate. If a tank and a filter, etc., are provided for each discharge port, the processing liquid supplied to a certain discharge port may differ in quality from the processing liquid supplied to another discharge port. On the other hand, with the present preferred embodiment, the supply flow passage is branched so that the processing liquids supplied from the same flow passage (supply flow passage) are discharged from the respective discharge ports. The processing liquids of the same quality can thereby be discharged from the respective discharge ports. Further, in comparison to an arrangement where a tank and a filter, etc., are provided according to each discharge port, the number of parts can be reduced and maintenance work can be simplified.

The temperature of the processing liquid may have a large influence on the processing of the substrate. If the downstream heaters are stopped during discharge stoppage, it will take time for the temperatures of the processing liquids, heated by the downstream heaters, to stabilize at the intended temperatures when operation of the downstream heaters is restarted. The discharges of the processing liquids thus cannot be restarted immediately and throughput (number of substrates processed per unit time) decreases. It is therefore preferable for the liquids to be heated by the downstream heaters even during discharge stoppage.

With this arrangement, during discharge stoppage, the liquids are supplied to the upstream flow passages and heated by the downstream heaters. The liquids heated by the downstream heaters are not discharged from the plurality of discharge ports but flow from the upstream flow passages into the return flow passages. A state where the temperatures of the downstream heaters are stable can thus be maintained even during discharge stoppage. The discharge of the processing liquid can thus be restarted immediately.

In the present preferred embodiment, at least one of the following features may be added to the above substrate processing apparatus.

The processing liquid supplying system further includes a first chemical liquid flow passage, a second chemical liquid flow passage, a pure water flow passage, and an upstream switching unit, and the first chemical liquid flow passage supplies the supply flow passage with a first chemical liquid, and the second chemical liquid flow passage supplies the supply flow passage with a second chemical liquid, and the pure water flow passage supplies the supply flow passage with a pure water, and the upstream switching unit is switched into any one of a plurality of states including a discharge state in which the first chemical liquid and the second chemical liquid are supplied to the supply flow passage, and a discharge stoppage state in which the pure water is supplied to the supply flow passage and the supplying of the first chemical liquid and the second chemical liquid into the supply flow passage is stopped.

The first chemical liquid and the second chemical liquid may be chemical liquids of the same type or may be chemical liquids of different types. The pure water may be a pure water of the room temperature (for example, of 20 to 30° C.) or may be a hot water, i.e. a pure water of higher temperature than the room temperature. Although there is no need to do so, the pure water supplied to the return flow passage may be reused. That is, the pure water supplied to the return flow passage may be supplied to the supply flow passage from the pure water flow passage again.

With this arrangement, the first chemical liquid and the second chemical liquid respectively stored in two tanks are supplied to the supply flow passage. In a case where liquid including the first chemical liquid and the second chemical liquid is heated by the downstream heater during discharge stoppage state, since this liquid cannot be returned to the two tanks for the first chemical liquid and the second chemical liquid, the consumption amount of the first chemical liquid and the second chemical liquid increases. With this arrangement, during discharge stoppage state, the pure water is supplied to the upstream flow passages and heated by the downstream heaters. Thus, a state where the temperatures of the downstream heaters are stable is maintained while reducing the consumption amount of the processing liquid.

The processing liquid supplying system further includes a drain flow passage and a recovery/drainage switching unit, and the drain flow passage is connected to the plurality of return flow passages, and the recovery/drainage switching unit is switched into any one of a plurality of states including a recovery state in which liquids flowing through the plurality of return flow passages are guided to a recovery unit, a drainage state in which the liquids flowing through the plurality of return flow passages are guided to the drain flow passage.

With this arrangement, since the processing liquid that has passed through the downstream heaters during discharge stoppage can be returned to the recovery unit, a state where the temperatures of the downstream heaters are stable is maintained while reducing the consumption amount of the processing liquid. Further, the processing liquid that has passed through the downstream heaters during discharge stoppage also can be expelled without being returned to the recovery unit. For example, in a case where two types of liquids respectively stored in two tanks are supplied to the supply flow passage, since the processing liquid contains the two types of liquids, this processing liquid cannot be returned to the two tanks. With this arrangement, any one of the recovery and the drainage can be selected and thus a state where the temperatures of the downstream heaters are stable is maintained even in such a case.

The processing liquid supplying system further includes a plurality of downstream flow passages, each of the plurality of auxiliary upstream flow passages is a branching upstream flow passage that branches into a plurality of the downstream flow passages, and each auxiliary discharge port is respectively provided according to each downstream flow passage.

With this arrangement, the flow passages supplying the processing liquids to the plurality of discharge ports are branched into multiple stages. That is, the supply flow passage branches into the plurality of upstream flow passages (first branching) and the branching upstream flow passages, included among the plurality of upstream flow passages, branch into the plurality of downstream flow passages (second branching). The number of discharge ports can thus be increased in comparison to a case where the branching upstream flow passages are not included among the plurality of upstream flow passages. The temperature uniformity of the processing liquid on the substrate can thereby be increased further and the processing uniformity can be increased further.

The substrate processing apparatus further includes a chamber housing the substrate held by the substrate holding unit and the branching upstream flow passages branch into the plurality of downstream flow passages inside the chamber.

With this arrangement, upstream ends of the plurality of downstream flow passages are disposed inside the chamber. The branching upstream flow passages branch into the plurality of downstream flow passages inside the chamber. Each downstream flow passage can thus be reduced in length (length in a direction in which the liquid flows) in comparison to a case where the branching upstream flow passages are branched outside the chamber. Temperature decrease of the processing liquid due to heat transfer from the processing liquid to each downstream flow passage can thereby be suppressed.

The processing liquid supplying system further includes an upstream heater, and the upstream heater heats the liquid to be supplied to the supply flow passage at an upstream temperature, and the plurality of downstream heaters heat the liquids flowing through the plurality of auxiliary upstream flow passages at a downstream temperature higher than the upstream temperature.

If the processing liquid is higher in temperature than the substrate, the heat of the processing liquid is transferred from the processing liquid to the substrate. Also, since the processing liquid rotates together with the substrate, the processing liquid on the substrate flows outward along the upper surface of the substrate while being cooled by air. Circumferential speeds of respective portions of the substrate increase as the distance from the rotational axis increases. The processing liquid on the substrate is cooled more readily when the circumferential speed is higher. Also, if it is supposed that the upper surface of the substrate can be divided into a plurality of circular annular regions at equal intervals in a radial direction, the respective regions increase in area as the distance from the rotational axis increases. When the surface area increases, heat to be transferred from the processing liquid to a circular annular region increases. Therefore if the temperatures of the processing liquids discharged from the discharge ports are all the same, sufficient temperature uniformity may not be obtained.

With this arrangement, the processing liquids that have been heated at the downstream temperatures higher than the upstream temperature by the downstream heaters are supplied to the plurality of auxiliary discharge ports from the plurality of auxiliary upstream flow passages and is discharged from these ports. That is, whereas the processing liquid of the upstream temperature is discharged from the main discharge port, the processing liquid of higher temperature than the upstream temperature is discharged from the auxiliary discharge port. Since the temperatures of the processing liquids supplied to the upper surface of the substrate increase stepwise as the distance from the rotational axis increases, the temperature uniformity of the processing liquid on the substrate can thus be increased in comparison to a case where the processing liquid of the same temperature is discharged from each discharge port. The processing uniformity can thereby be increased while reducing the consumption amount of the processing liquid.

The processing liquid supplying system further includes a first nozzle and a second nozzle, the plurality of discharge ports include a first discharge port, disposed in the first nozzle, and a second discharge port, disposed in the second nozzle, and are aligned in a radial direction orthogonal to the rotational axis in a plan view, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

With this arrangement, the first discharge port and the second discharge port are aligned in the radial direction in a plan view. When a plurality of nozzles of the same length are aligned in the horizontal direction orthogonal to the longitudinal direction so that the plurality of discharge ports are aligned in the radial direction in a plan view, an entirety of the plurality of nozzles increases in width (see FIG. 9). When a plurality of nozzles of different lengths are aligned in a vertical direction so that the plurality of discharge ports are aligned in the radial direction in a plan view, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

Another preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes a tank, an upstream heater, a supply flow passage, a plurality of upstream flow passages, a plurality of discharge ports, a plurality of return flow passages, a plurality of downstream heaters, a downstream switching unit, and a plurality of return flow control valves. The tank stores the processing liquid to be supplied to the supply flow passage. The upstream heater adjusts a temperature of the processing liquid inside the tank by heating the processing liquid. The supply flow passage guides the processing liquid toward the plurality of upstream flow passages. The plurality of upstream flow passages branch from the supply flow passage and guide the processing liquid supplied from the supply flow passage toward the plurality of discharge ports. The plurality of discharge ports include a main discharge port discharging the processing liquid toward an upper surface central portion of the substrate and a plurality of auxiliary discharge ports discharging the processing liquid toward a plurality of positions within an upper surface of the substrate, the plurality of positions being away from the upper surface central portion and differing in distance from the rotational axis, and are respectively disposed at a plurality of positions differing in distance from the rotational axis, and respectively discharge the processing liquid supplied via the plurality of upstream flow passages toward the upper surface of the substrate held by the substrate holding unit. The plurality of upstream flow passages include a main upstream flow passage connected to the main discharge port and a plurality of auxiliary upstream flow passages connected to the plurality of auxiliary discharge ports. The plurality of return flow passages are respectively connected to the plurality of auxiliary upstream flow passages at positions further upstream than the plurality of auxiliary discharge ports, and guide the processing liquid supplied from the plurality of auxiliary upstream flow passages toward the tank. The plurality of downstream heaters are respectively connected to the plurality of auxiliary upstream flow passages at positions further upstream than a connection position between the return flow passage and the auxiliary upstream flow passage, and heat the processing liquids flowing through the plurality of auxiliary upstream flow passages. The downstream switching unit is switched into any one of a plurality of states including a discharge state in which the processing liquid, supplied to the plurality of upstream flow passages from the supply flow passage, is supplied to the plurality of discharge ports, and a discharge stoppage state in which the processing liquid, supplied to the plurality of upstream flow passages from the supply flow passage, is supplied to the plurality of return flow passage. The plurality of return flow control valves are respectively connected to the plurality of upstream flow passages, and make a flow rate of the processing liquid supplied to the plurality of upstream flow passages from the supply flow passage during the discharge stoppage state smaller than a flow rate of the processing liquid supplied to the plurality of upstream flow passages from the supply flow passage during the discharge state.

With this arrangement, the supply flow passage guiding the processing liquid branches into the plurality of upstream flow passages. The number of discharge ports can thereby be increased. The processing liquid flowing through the supply flow passage is supplied to the discharge ports via the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

In a case where processing liquids are discharged from a plurality of discharge ports toward a plurality of positions that are separated in a radial direction, it is important, in terms of improvement of processing uniformity, that processing liquids of the same quality are supplied to the respective portions of the substrate. If a tank and a filter, etc., are provided for each discharge port, the processing liquid supplied to a certain discharge port may differ in quality from the processing liquid supplied to another discharge port. On the other hand, with the present preferred embodiment, the supply flow passage is branched so that the processing liquids supplied from the same flow passage (supply flow passage) are discharged from the respective discharge ports. Processing liquids of the same quality can thereby be discharged from the respective discharge ports. Further, in comparison to an arrangement where a tank and a filter, etc., are provided according to each discharge port, the number of parts can be reduced and maintenance work can be simplified.

The temperature of the processing liquid may have a large influence on the processing of the substrate. If the downstream heaters are stopped during discharge stoppage, it will take time for the temperatures of the processing liquids, heated by the downstream heaters, to stabilize at the intended temperatures when operation of the downstream heaters is started or restarted. The discharges of the processing liquids thus cannot be started or restarted immediately and throughput (number of substrates processed per unit time) decreases. It is therefore preferable for the liquids to be heated by the downstream heaters even during discharge stoppage. On the other hand, when the processing liquid heated by the downstream heaters returns to a tank, the temperature of the processing liquid in the tank changes. When the processing liquid heated by the downstream heaters is discarded, the consumption amount of the processing liquid increases.

With this arrangement, during discharge stoppage, the processing liquids are supplied to the upstream flow passages and heated by the downstream heaters. A state where the temperatures of the downstream heaters are stable can thus be maintained even during discharge stoppage. The discharge of the processing liquid can thus be restarted immediately. Further, the processing liquid heated by the downstream heaters returns to the tank via the return flow passage during discharge stoppage and thus the consumption amount of the processing liquid decreases. Furthermore, the plurality of return flow control valves decrease the flow rate of the processing liquid returned to the tank from the return flow passage, and thus a heat amount applied to the processing liquid in the tank can be reduced and variation of temperature of liquid can be suppressed.

In the present preferred embodiment, at least one of the following features may be added to the above substrate processing apparatus.

The processing liquid supplying system further includes a cooler that cools the processing liquid flowing through the plurality of return flow passages toward the tank.

With this arrangement, not only during discharge state, but also during discharge stoppage state, the processing liquid is supplied to the downstream heaters and heated by the downstream heaters. The processing liquid heated by the downstream heater during discharge stoppage state flows to the return flow passage from the upstream passage. The processing liquid flowing through the return flow passage toward the tank is cooled by the cooler. Thus, the processing liquid that has cooled by the cooler returns to the tank. As a result, the variation of the temperature of the processing liquid in the tank can be further suppressed.

The processing liquid supplying system further includes a plurality of downstream flow passages, each of the plurality of auxiliary upstream flow passages is a branching upstream flow passage that branches into a plurality of the downstream flow passages, and each auxiliary discharge port is respectively provided according to each downstream flow passage.

With this arrangement, the flow passages supplying the processing liquids to the plurality of discharge ports are branched into multiple stages. That is, the supply flow passage branches into the plurality of upstream flow passages (first branching) and the branching upstream flow passages, included among the plurality of upstream flow passages, branch into the plurality of downstream flow passages (second branching). The number of discharge ports can thus be increased in comparison to a case where the branching upstream flow passages are not included among the plurality of upstream flow passages. The temperature uniformity of the processing liquid on the substrate can thereby be increased further and the processing uniformity can be increased further.

The substrate processing apparatus further includes a chamber housing the substrate held by the substrate holding unit and the branching upstream flow passages branch into the plurality of downstream flow passages inside the chamber.

With this arrangement, upstream ends of the plurality of downstream flow passages are disposed inside the chamber. The branching upstream flow passages branch into the plurality of downstream flow passages inside the chamber. Each downstream flow passage can thus be reduced in length (length in a direction in which the liquid flows) in comparison to a case where the branching upstream flow passages are branched outside the chamber. Temperature decrease of the processing liquid due to heat transfer from the processing liquid to each downstream flow passage can thereby be suppressed.

The upstream heater adjusts the temperature of the processing liquid inside the tank by heating the processing liquid at an upstream temperature, and the plurality of downstream heaters heat the processing liquids flowing through the plurality of auxiliary upstream flow passages at a downstream temperature higher than the upstream temperature.

With this arrangement, the processing liquids that have been heated at the downstream temperatures higher than the upstream temperature by the downstream heaters are supplied to the plurality of auxiliary discharge ports from the plurality of auxiliary upstream flow passages and are discharged from the discharge ports. That is, whereas the processing liquid of the upstream temperature is discharged from the main discharge port, the processing liquid of higher temperature than the upstream temperature is discharged from the auxiliary discharge port. Since the temperatures of the processing liquids supplied to the upper surface of the substrate increase stepwise as the distance from the rotational axis increases, the temperature uniformity of the processing liquid on the substrate can thus be increased in comparison to a case where the processing liquid of the same temperature is discharged from each discharge port. The processing uniformity can thereby be increased while reducing the consumption amount of the processing liquid.

The processing liquid supplying system further includes a first nozzle and a second nozzle, the plurality of discharge ports include a first discharge port, disposed in the first nozzle, and a second discharge port, disposed in the second nozzle, and are aligned in a radial direction orthogonal to the rotational axis in a plan view, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

With this arrangement, the first discharge port and the second discharge port are aligned in the radial direction in a plan view. When a plurality of nozzles of the same length are aligned in the horizontal direction orthogonal to the longitudinal direction so that the plurality of discharge ports are aligned in the radial direction in a plan view, an entirety of the plurality of nozzles increases in width (see FIG. 9). When a plurality of nozzles of different lengths are aligned in a vertical direction so that the plurality of discharge ports are aligned in the radial direction in a plan view, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 12 is a schematic view of a processing liquid supplying system of a substrate processing apparatus according to a second preferred embodiment of the present invention and shows the processing liquid supplying system in a discharging state.

FIG. 13 is a schematic view of a processing liquid supplying system of the substrate processing apparatus according to the second preferred embodiment of the present invention and shows the processing liquid supplying system in a discharge stoppage state.

DETAILED DESCRIPTION OF PREFERRED EMBODIMENTS

Figure 1:
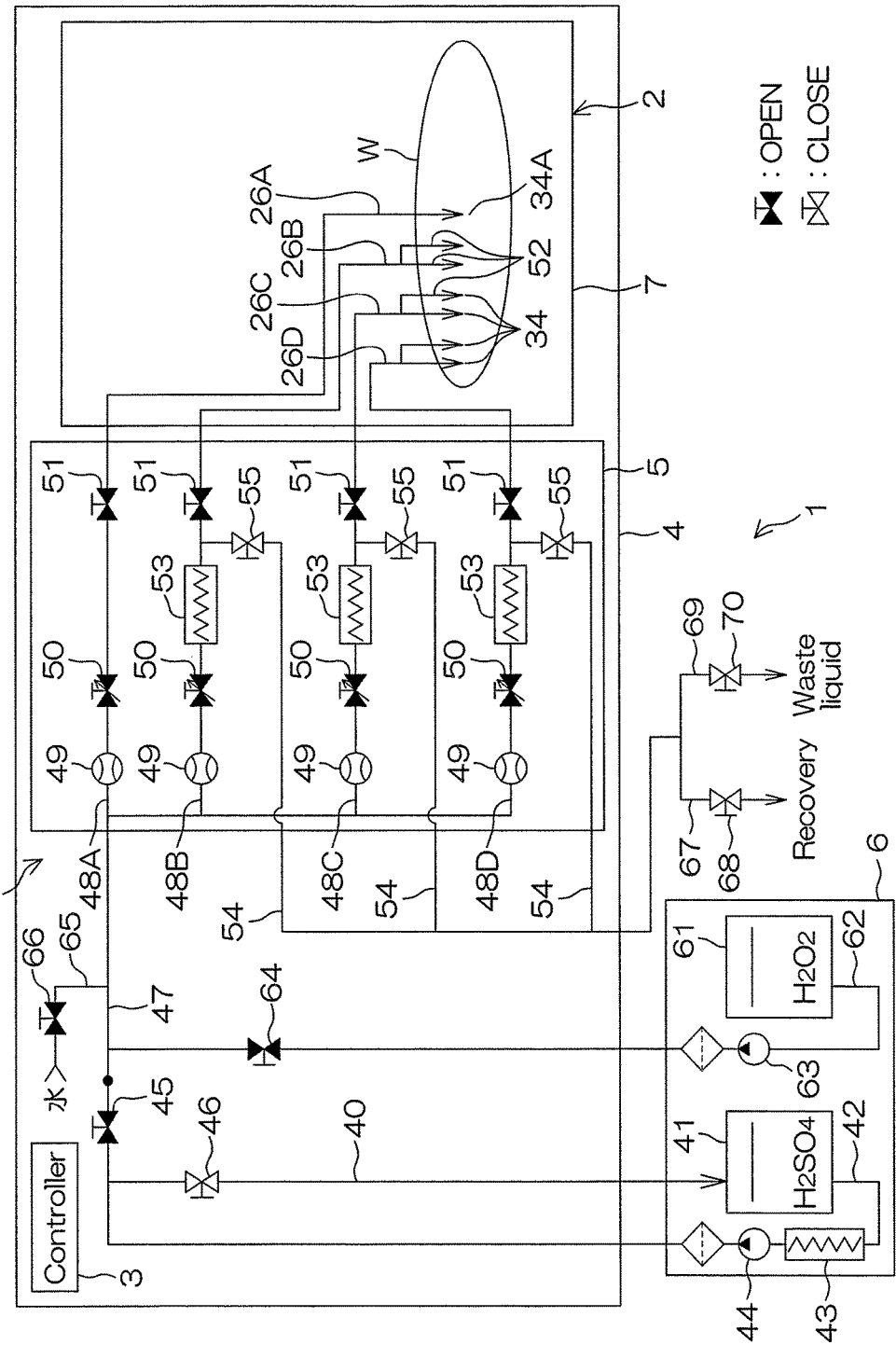
FIG. 1 is a schematic view of a processing liquid supplying system of a substrate processing apparatus according to a first preferred embodiment of the present invention and shows the processing liquid supplying system in a discharging state.
Figure 2:
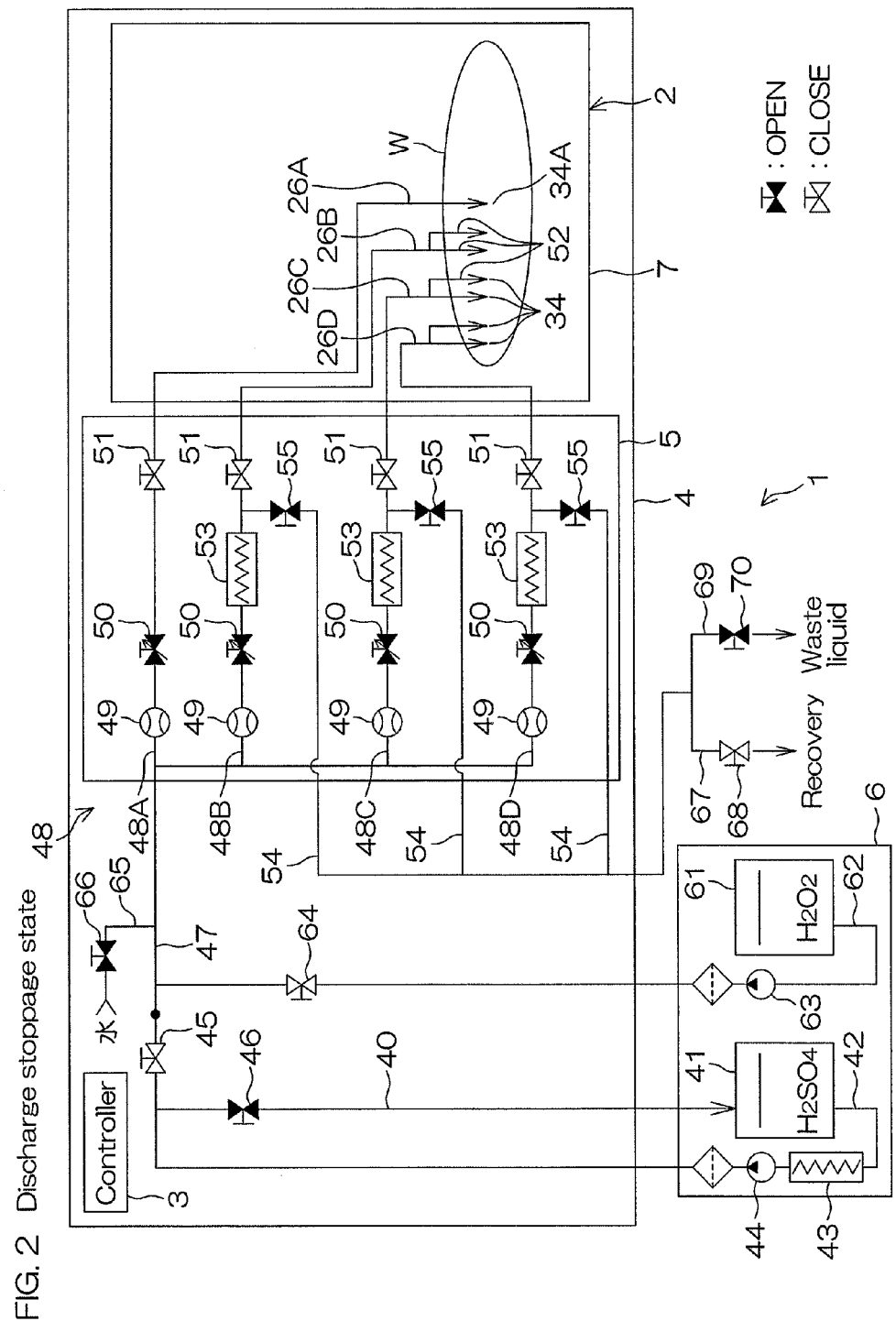
FIG. 2 is a schematic view of a processing liquid supplying system of the substrate processing apparatus according to the first preferred embodiment of the present invention and shows the processing liquid supplying system in a discharge stoppage state.

FIG. 1 and FIG. 2 are schematic views of a processing liquid supplying system of a substrate processing apparatus 1 according to a preferred embodiment of the present invention. FIG. 1 shows the processing liquid supplying system in a discharging state and FIG. 2 shows the processing liquid supplying system in a discharge stoppage state.

The substrate processing apparatus 1 is a single substrate processing type apparatus that processes a disk-shaped substrate W, such as a semiconductor wafer, etc., one by one. The substrate processing apparatus 1 includes a processing unit 2 that processes the substrate W with a processing liquid, a transfer robot (not shown) that conveys the substrate W to the processing unit 2, and a controller 3 that controls the substrate processing apparatus 1. The controller 3 is a computer that includes a computing portion and a storage portion.

The substrate processing apparatus 1 includes a plurality of fluid boxes 5, each housing fluid devices including a valve 51 that controls supplying of the processing liquid to the processing unit 2 and its stoppage, and a plurality of storage boxes 6, each housing a tank 41 storing the processing liquid to be supplied to the processing unit 2 via the fluid boxes 5. The processing unit 2 and the fluid boxes 5 are disposed inside a frame 4 of the substrate processing apparatus 1. A chamber 7 of the processing unit 2 and the fluid boxes 5 are aligned in a horizontal direction. The storage boxes 6 are disposed outside the frame 4. The storages boxes 6 may be disposed inside the frame 4.

Figure 3:
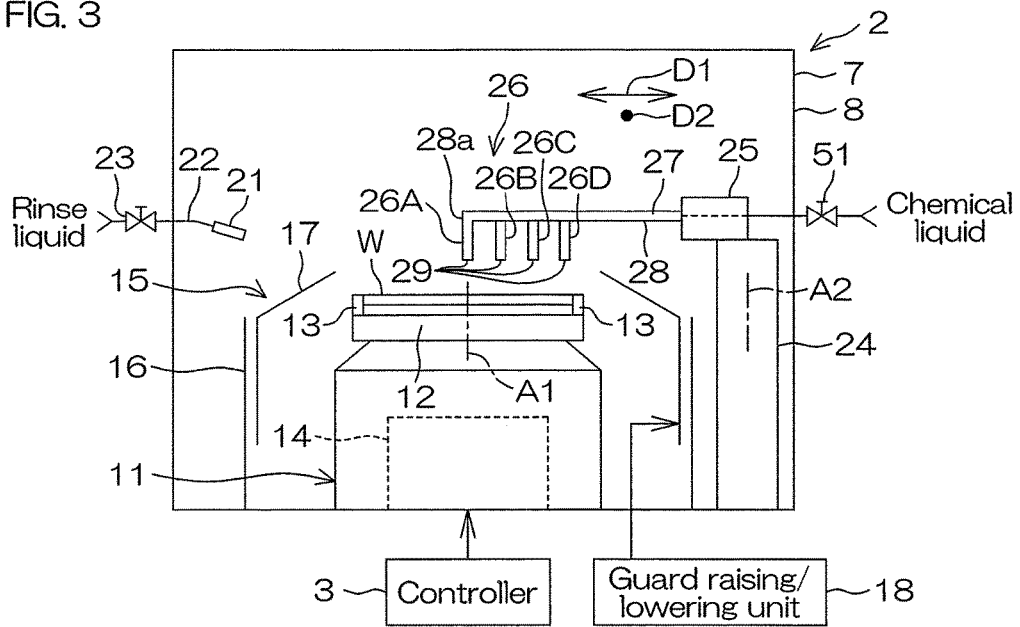
FIG. 3 is a schematic front view of an interior of a processing unit included in the substrate processing apparatus.
Figure 4:
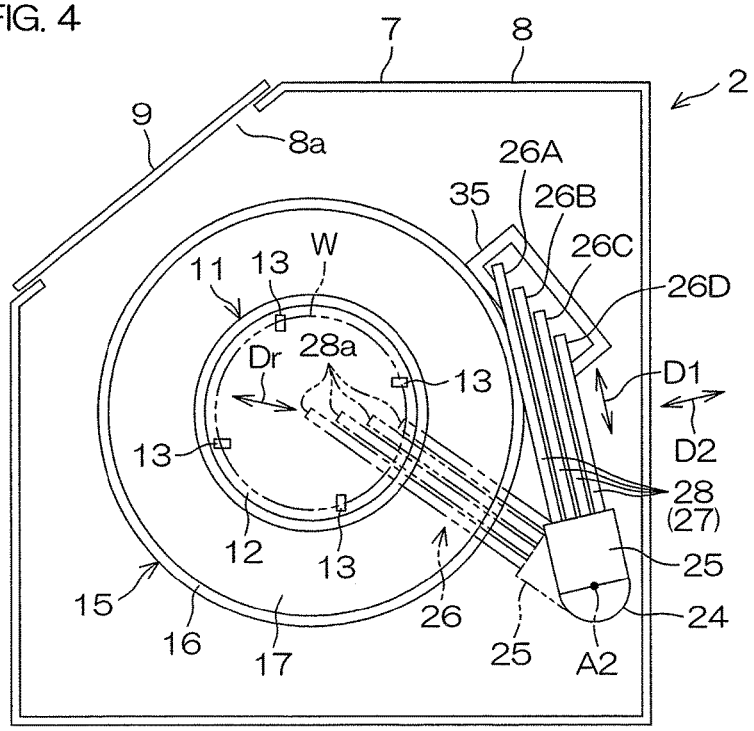
FIG. 4 is a schematic plan view of the interior of the processing unit included in the substrate processing apparatus.

FIG. 3 is a schematic front view of an interior of the processing unit 2. FIG. 4 is a schematic plan view of the interior of the processing unit 2.

As shown in FIG. 3, the processing unit 2 includes a box-shaped chamber 7, a spin chuck 11 rotating the substrate W around a vertical rotational axis A1 passing through a central portion of the substrate W while holding the substrate W horizontally inside the chamber 7, and a cylindrical cup 15 receiving the processing liquid expelled from the substrate W.

As shown in FIG. 4, the chamber 7 includes a box-shaped partition wall 8, provided with a carry-in/carry-out port 8a through which the substrate W passes, and a shutter 9 that opens and closes the carry-in/carry-out port 8a. The shutter 9 is movable with respect to the partition wall 8 between an open position at which the carry-in/carry-out port 8a is open and a closed position (position shown in FIG. 4) at which the carry-in/carry-out port 8a is closed. The unillustrated transfer robot carries the substrate W into the chamber 7 through the carry-in/carry-out port 8a and carries out the substrate W from the chamber 7 through the carry-in/carry-out port 8a.

As shown in FIG. 3, the spin chuck 11 includes a disk-shaped spin base 12 that is held in a horizontal orientation, a plurality of chuck pins 13 that hold the substrate W in a horizontal orientation above the spin base 12, and a spin motor 14 that rotates the plurality of chuck pins 13 to rotate the substrate W around a rotational axis A1. The spin chuck 11 is not restricted to a clamping type chuck in which the plurality of chuck pins 13 are brought into contact with a peripheral end surface of the substrate W, and may be a vacuum type chuck in which a rear surface (lower surface) of the substrate W that is a non-device forming surface is suctioned onto an upper surface of the spin base 12 to hold the substrate horizontally.

As shown in FIG. 3, the cup 15 includes a cylindrical splash guard 17 that surrounds the spin chuck 11 around the rotational axis A1 and a circular cylindrical outer wall 16 surrounding the splash guard 17 around the rotational axis A1. The processing unit 2 includes a guard raising/lowering unit 18 that raises and lowers the splash guard 17 vertically between an upper position (position shown in FIG. 3) at which an upper end of the splash guard 17 is positioned higher than a position at which the spin chuck 11 holds the substrate W and a lower position at which the upper end of the splash guard 17 is positioned lower than the position at which the spin chuck 11 holds the substrate W.

As shown in FIG. 3, the processing unit 2 includes a rinse liquid nozzle 21 that discharges a rinse liquid downward toward an upper surface of the substrate W held by the spin chuck 11. The rinse liquid nozzle 21 is connected to a rinse liquid piping 22 in which a rinse liquid valve 23 is interposed. The processing unit 2 may include a nozzle moving unit that moves the rinse liquid nozzle 21 between a processing position and a standby position.

When the rinse liquid valve 23 is opened, the rinse liquid is supplied from the rinse liquid piping 22 to the rinse liquid nozzle 21 and discharged from the rinse liquid nozzle 21. The rinse liquid is, for example, pure water (deionized water). The rinse liquid is not restricted to pure water and may instead be any of carbonated water, electrolyzed ion water, hydrogen water, ozone water, or aqueous hydrochloric acid solution of dilute concentration (of, for example, approximately 10 to 100 ppm), etc.

As shown in FIG. 4, the processing unit 2 includes a plurality of nozzles 26 (first nozzle 26A, second nozzle 26B, third nozzle 26C, and fourth nozzle 26D) that discharge chemical liquids downward, a holder 25 that holds each of the plurality of nozzles 26, and a nozzle moving unit 24 that moves the holder 25 to move the plurality of nozzles 26 between a processing position (position indicated by alternate long and two short dashes lines in FIG. 4) and a standby position (position indicated by solid lines in FIG. 4).

Representative examples of the chemical liquid include etching liquids, such as TMAH (tetramethylammonium hydroxide aqueous solution), etc., and resist removing liquids, such as SPM (sulfuric acid/hydrogen peroxide mixture), etc. The chemical liquid is not restricted to TMAH and SPM, and may be a liquid containing at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali besides TMAH, a surfactant, and a corrosion inhibitor.

As shown in FIG. 3, each of the nozzles 26 includes a main nozzle body 27 that is cantilevered by the holder 25. The main nozzle body 27 includes an arm portion 28 extending in a horizontal longitudinal direction D1 from the holder 25 and a tip portion 29 extending downward from a tip 28a of the arm portion 28. The tip 28a of the arm portion 28 means a portion disposed furthest in the longitudinal direction D1 from the holder 25 in a plan view.

As shown in FIG. 4, the plurality of arm portions are aligned in a horizontal alignment direction D2, orthogonal to the longitudinal direction D1, in the order of the first nozzle 26A to the fourth nozzle 26D. The plurality of arm portions 28 are disposed at the same height. An interval between two arm portions 28 that are adjacent in the alignment direction D2 may be the same as any of the other intervals or may differ from at least one of the other intervals. FIG. 4 shows an example where the plurality of arm portions 28 are disposed at equal intervals.

Lengths of the plurality of arm portions 28 in the longitudinal direction D1 decrease in the order of the first nozzle 26A to the fourth nozzle 26D. Tips of the plurality of nozzles 26 (the tips 28a of the plurality of arm portions 28) are shifted in the longitudinal direction D1 so as to be aligned in the order of the first nozzle 26A to the fourth nozzle 26D in regard to the longitudinal direction D1. The tips of the plurality of nozzles 26 are aligned rectilinearly in a plan view.

The nozzle moving unit 24 makes the holder 25 pivot around a nozzle pivoting axis A2 extending vertically at a periphery of the cup 15 to move the plurality of nozzles 26 along an arcuate path passing the substrate W in a plan view. The plurality of nozzles 26 are thereby moved horizontally between the processing position and the standby position. The processing unit 2 includes a bottomed cylindrical standby pot 35 that is disposed below the standby position of the plurality of nozzles 26. The standby pot 35 is disposed at a periphery of the cup 15 in a plan view.

The processing position is a position at which the chemical liquids discharged from the plurality of nozzles 26 land on the upper surface of the substrate W. At the processing position, the plurality of nozzles 26 and the substrate W overlap in a plan view and the tips of the plurality of nozzles 26 are aligned in a radial direction Dr in the order of the first nozzle 26A to the fourth nozzle 26D from the rotational axis A1 side. In this state, the tip of the first nozzle 26A overlaps with a central portion of the substrate W in a plan view and the tip of the fourth nozzle 26D overlaps with a peripheral edge portion of the substrate W in a plan view.

The standby position is a position to which the plurality of nozzles 26 are retracted so that the plurality of nozzles 26 and the substrate W do not overlap in a plan view. At the standby position, the tips of the plurality of nozzles 26, in a plan view, are positioned outside the cup 15 and along an outer circumferential surface of the cup 15 (outer circumferential surface of the outer wall 16) and are aligned in a circumferential direction (direction around the rotational axis A1) in the order of the first nozzle 26A to the fourth nozzle 26D. The plurality of nozzles 26 are disposed so as to move away from the rotational axis A1 in the order of the first nozzle 26A to the fourth nozzle 26D.

The plurality of nozzles 26 shall now be described with reference to FIG. 5 and FIG. 6. Thereafter, the processing liquid supplying system shall be described.

In the following description, "first" and "A" may be added to the beginning and the end of an arrangement corresponding to the first nozzle 26A. For example, an upstream flow passage 48 associated with the first nozzle 26A may be referred to as the "first upstream flow passage 48A." The same applies to arrangements associated with the second nozzle 26B to the fourth nozzle 26D.

Also in the following description, a temperature at which the processing liquid is heated by an upstream heater 43 may be referred to as the "upstream temperature" and a temperature at which the processing liquid is heated by a downstream heater 53 may be referred to as the "downstream temperature." Temperatures at which the processing liquids are heated by a second downstream heater 53 to a fourth downstream heater 53 may be referred to respectively as the "second downstream temperature" to the "fourth heating temperature."

Figure 5:
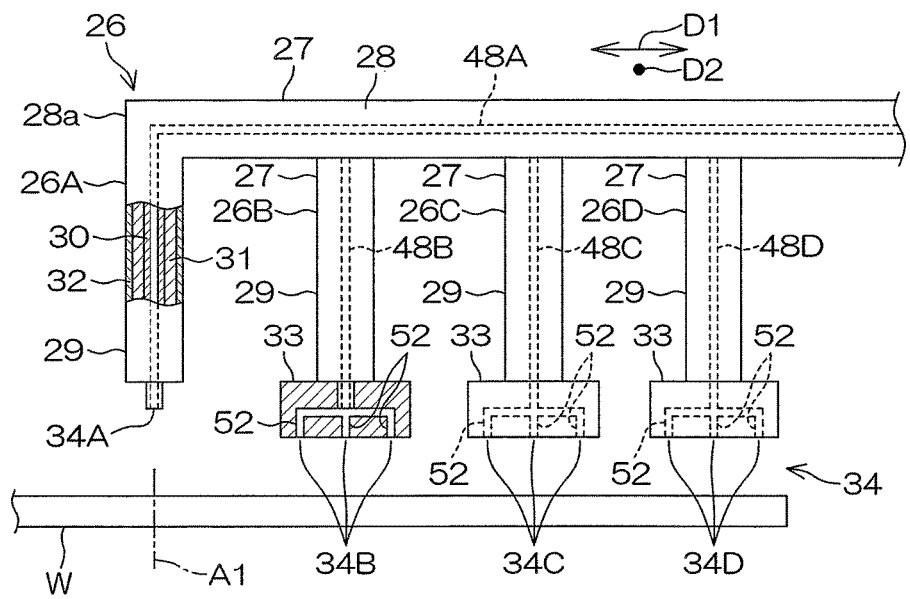
FIG. 5 is a schematic front view of a plurality of nozzles.

As shown in FIG. 5, each main nozzle body 27 includes a resin tube 30 that guides the processing liquid, a core bar 31 including cylindrical cross section that surrounds the resin tube 30, and a resin coating 32 including cylindrical cross section that surrounds an outer surface of the core bar 31. Each of the nozzles 26 besides the first nozzle 26A further includes a nozzle head 33 mounted on the tip portion 29 of the main nozzle body 27.

Each main nozzle body 27 defines a single flow passage extending along the main nozzle body 27. Each nozzle head 33 defines a plurality of flow passages guiding the processing liquid supplied from the main nozzle body 27. The flow passage of the main nozzle body 27 defines a discharge port 34 opening at an outer surface of the main nozzle body 27. The plurality of flow passages of the nozzle head 33 define a plurality of discharge ports 34 opening at an outer surface of the nozzle head 33. The flow passage of the main nozzle body 27 corresponds to a portion of an upstream flow passage 48 to be described below. Each of the flow passages of the nozzle head 33 corresponds to a downstream flow passage 52 to be described below. Downstream ends of the first upstream flow passage 48A to the fourth upstream flow passage 48D are respectively disposed at a plurality of positions differing in distance from the rotational axis A1.

Figure 6:
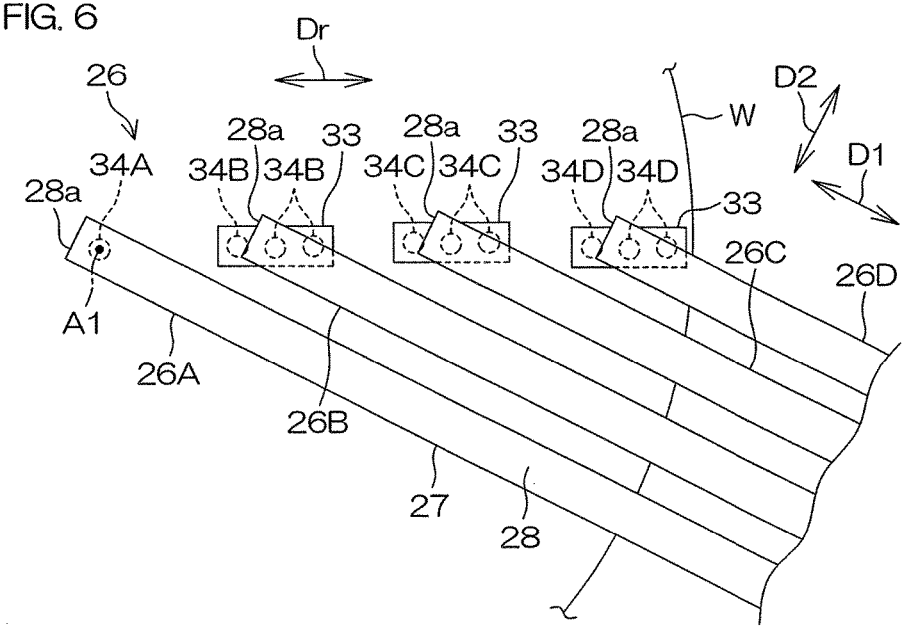
FIG. 6 is a schematic plan view of the plurality of nozzles.

FIG. 5 and FIG. 6 show an example where the total number of discharge ports 34 disposed in the plurality of nozzles 26 is ten. The first nozzle 26A includes a single discharge port 34 disposed in the main nozzle body 27. Each of the nozzles 26 besides the first nozzle 26A includes three discharge ports 34 disposed in the nozzle head 33. The three discharge ports 34 disposed in the same nozzle head 33 are constituted of an inner discharge port that is closest to the rotational axis A1 among the three discharge ports 34, an outer discharge port that is furthest from the rotational axis A1 among the three discharge ports 34, and a middle discharge port disposed between the inner discharge port and the outer discharge port.

As shown in FIG. 6, the plurality of discharge ports 34 are aligned rectilinearly in a plan view. An interval between the two discharge ports 34 at the respective ends is not more than a radius of the substrate W. An interval between two discharge ports 34 that are adjacent may be the same as any of the other intervals or may differ from at least one of the other intervals. Also, the plurality of discharge ports 34 may be disposed at the same height or maybe disposed at two or more different heights.

When the plurality of nozzles 26 are disposed at the processing position, the plurality of discharge ports 34 are respectively disposed at a plurality of positions that differ in distance (shortest distance in a plan view) from the rotational axis A1. In this state, an innermost discharge port (first discharge port 34A) that is closest to the rotational axis A1 among the plurality of discharge ports 34 is disposed above a central portion of the substrate W, and an outermost discharge port (fourth discharge port 34D) that is furthest from the rotational axis A1 among the plurality of discharge ports 34 is disposed above a peripheral edge portion of the substrate W. The plurality of discharge ports 34 are aligned in the radial direction Dr in a plan view.

The first discharge port 34A disposed in the first nozzle 26A is a main discharge port that discharges the processing liquid toward an upper surface central portion of the substrate W. The second discharge port 34B to the fourth discharge port 34D that are disposed in the respective nozzles 26 besides the first nozzle 26A are a plurality of auxiliary discharge ports that discharge the processing liquids toward a portion of the upper surface of the substrate W besides the central portion. The first upstream flow passage 48A connected to the first discharge port 34A is a main upstream flow passage and the second upstream flow passage 48B to the fourth upstream flow passage 48D that are connected to the second discharge port 34B to the fourth discharge port 34D are a plurality of auxiliary upstream flow passages.

As shown in FIG. 5, each discharge port 34 discharges the chemical liquid in a discharge direction perpendicular to the upper surface of the substrate W. The plurality of discharge ports 34 discharge the chemical liquids toward a plurality of liquid landing positions within the upper surface of the substrate W. The plurality of liquid landing positions are separate positions that differ in distance from the rotational axis A1. If the liquid landing position that is closest to the rotational axis A1 among the plurality of liquid landing positions is referred to as the "first liquid landing position" and the liquid landing position that is second closest to the rotational axis A1 among the plurality of liquid landing positions is referred to as the "second liquid landing position," the chemical liquid discharged from the first discharge port 34A lands on the first liquid landing position and the chemical liquid discharged from the second discharge port 34B lands on the second liquid landing position.

The processing liquid supplying system shall now be described in detail with reference to FIG. 1 and FIG. 2.

The processing liquid supplying system includes a first chemical liquid tank 41 storing sulfuric acid serving as first chemical liquid, a second chemical liquid tank 61 storing hydrogen peroxide water serving as second chemical liquid, and a pure water flow passage 65 guiding pure water.

The processing liquid supplying system includes a first chemical liquid flow passage 42 guiding the sulfuric acid fed from first chemical liquid tank 41, a first upstream heater 43 heating the sulfuric acid flowing inside the first chemical liquid flow passage 42 at the upstream temperature higher than room temperature (for example, of 20 to 30° C.) to adjust the temperature of the sulfuric acid inside the first chemical liquid tank 41, a first pump 44 feeding the sulfuric acid inside the first chemical liquid tank 41 to the first chemical liquid flow passage 42, and a first circulation flow passage 40 returning the sulfuric acid inside the first chemical liquid flow passage 42 to the first chemical liquid tank 41.

The processing liquid supplying system includes a second chemical liquid flow passage 62 guiding the hydrogen peroxide water fed from the second chemical liquid tank 61, and a second pump 63 feeding the hydrogen peroxide water inside the second chemical liquid tank 61 to the second chemical liquid flow passage 62. The processing liquid supplying system may further include a second upstream heater heating the hydrogen peroxide water flowing through the second chemical liquid flow passage 62.

The processing liquid supplying system includes a first chemical liquid supply valve 45 that opens and closes the first chemical liquid flow passage 42, a first circulation valve 46 that opens and closes the circulation flow passage 40, a second chemical liquid supply valve 64 that opens and closes the second chemical liquid flow passage 62, a pure water supply valve 66 that opens and closes the pure water flow passage 65, and a supply flow passage 47 connected to each of the first chemical liquid flow passage 42, the second chemical liquid flow passage 62, and the pure water flow passage 65. An upstream switching unit includes the first chemical liquid supply valve 45, the second chemical liquid supply valve 64, and the pure water supply valve 66.

The processing liquid supplying system includes the plurality of upstream flow passages 48 guiding the liquid supplied from the supply flow passage 47 to the plurality of discharge ports 34, a plurality of flowmeters 49 detecting flow rates of the liquids flowing inside the plurality of upstream flow passages 48, a plurality of flow control valves 50 that change the flow rates of the liquids flowing inside the plurality of upstream flow passages 48, and a plurality of discharge valves 51 respectively opening and closing the plurality of upstream flow passages 48. Although unillustrated, each flow control valve 50 includes a main valve body that opens and closes the flow passage and an actuator that changes an open degree of the main valve body. The actuator may be a pneumatic actuator or an electric actuator or an actuator besides these.

The processing liquid supplying system includes the plurality of downstream flow passages 52 that guide the liquids supplied from the upstream flow passages 48 to the plurality of discharge ports 34. The downstream end of each of the upstream flow passages 48 besides the first upstream flow passage 48A branches into a plurality of downstream flow passage 52. That is, each of the upstream flow passages 48 besides the first upstream flow passage 48A is a branching upstream flow passage that branches into a plurality of downstream flow passage 52.

FIG. 1 and FIG. 2 show an example where each branching upstream flow passage branches into two downstream flow passages 52. FIG. 5 shows an example where each branching upstream flow passage branches into three downstream flow passages 52. The three downstream flow passages 52 branching from the second upstream flow passage 48B are respectively connected to the three discharge ports 34 (the inner discharge port, middle discharge port, and the outer discharge port) disposed in the same nozzle head 33. The same as the second upstream flow passage 48B applies to the third upstream flow passage 48C and the fourth upstream flow passage 48D. The first upstream flow passage 48A is connected to the first discharge port 34A disposed in the first nozzle 26A.

The processing liquid supplying system includes a plurality of downstream heaters 53 that heat the liquids flowing inside the plurality of upstream flow passages 48 besides the first upstream flow passage 48A at downstream temperatures higher than the upstream temperature. The processing liquid supplying system further includes a plurality of return flow passages 54, respectively connected to the plurality of upstream flow passages 48 besides the first upstream flow passage 48A at positions further downstream than the plurality of downstream heaters 53, and a plurality of return valves 55, respectively opening and closing the plurality of return flow passages 54. A downstream switching unit includes the plurality of discharge valves 51 and the plurality of return valves 55.

The processing liquid supplying system includes a recovery flow passage 67 that guides liquid supplied from the plurality of return flow passages 54 to a recovery unit, and a drain flow passage 69 that guides liquid supplied from the plurality of return flow passages 54 to a drain unit. The processing liquid supplying system further includes a recovery valve 68 that opens and closes the recovery flow passage 67, and a drain valve 70 that opens and closes the drain flow passage 69. A recovery/drainage unit includes the recovery valve 68 and the drain valve 70.

The processing liquid supplying system in a discharging state in which the chemical liquids are discharged from the plurality of discharge ports 34 shall now be described with reference to FIG. 1. In FIG. 1, an open valve is indicated in black and a closed valve is indicated in white.

The sulfuric acid in the first chemical liquid tank 41 is heated by the first upstream heater 43 and thereafter flows to the supply flow passage 47 from the first chemical liquid flow passage 42. The hydrogen peroxide water in the second chemical liquid tank 61 flows to the supply flow passage 47 from the second chemical liquid flow passage 62. Thus, the sulfuric acid and the hydrogen peroxide water are mixed with each other in the supply flow passage 47 and generate heat. The chemical liquid (SPM) generated in the supply flow passage 47 flows to the plurality of upstream flow passages 48 from the supply flow passage 47. The chemical liquids supplied to the plurality of branching upstream flow passages, i.e. the plurality of upstream flow passages 48 besides the first upstream flow passage 48A are heated by the downstream heaters 53 and thereafter flow to the plurality of downstream flow passage 52.

The chemical liquid inside the first upstream flow passage 48A is supplied to the single first discharge port 34A disposed in the first nozzle 26A. The chemical liquid inside the second upstream flow passage 48B is supplied via the plurality of downstream flow passages 52 to the plurality of second discharge ports 34B disposed in the second nozzle 26B. The same as the second upstream flow passage 48B applies to the third upstream flow passage 48C and the fourth upstream flow passage 48D. The chemical liquids are thereby discharged from all discharge ports 34.

The heating temperatures (downstream temperatures) of the processing liquids by the downstream heaters 53 are higher than the heating temperature (upstream temperature) of the processing liquid by the upstream heater 43. The second to fourth downstream temperatures increase in the order of the second to the fourth downstream temperatures. The first discharge port 34A discharges the chemical liquid (SPM) of the upstream temperature. Each of the second discharge ports 34B discharges the chemical liquid of the second downstream temperature. Each of the third discharge ports 34C discharges the chemical liquid of the third downstream temperature. Each of the fourth discharge ports 34D discharges the chemical liquid of the fourth downstream temperature. The temperatures of the chemical liquids discharged from the plurality of discharge ports 34 thus increase stepwise with distance away from the rotational axis A1.

The processing liquid supplying system in a discharge stoppage state in which the discharges of chemical liquids from the plurality of discharge ports 34 are stopped shall now be described with reference to FIG. 2. In FIG. 2, an open valve is indicated in black and a closed valve is indicated in white.

The sulfuric acid inside the first chemical liquid tank 41 is fed to the first chemical liquid flow passage 42 by the first pump 44. The sulfuric acid fed by the first pump 44 is heated by the first upstream heater 43 and thereafter returned to the first chemical liquid tank 41 via the first circulation flow passage 40. During discharge stoppage state, both of the sulfuric acid and the hydrogen peroxide water are not supplied to the supply flow passage 47. On the other hand, the pure water inside the pure water flow passage 65 flows to the supply flow passage 47 and flows from the supply flow passage 47 to the plurality of upstream flow passages 48 besides the first upstream flow passage 48A.

The pure water inside the second upstream flow passage 48 is heated by the downstream heater 53 associated with the second upstream flow passage 48B and thereafter flows from the second upstream flow passage 48 to the return flow passage 54. The same as the second upstream flow passage 48B applies to the third upstream flow passage 48C and the fourth upstream flow passage 48D. FIG. 2 shows an example where the recovery valve 68 is closed and the drain valve 70 is opened. In this case, the pure water supplied to the plurality of return flow passages 54 is guided to the drain unit via the drain flow passage 69. The pure water supplied to the plurality of return flow passages 54 may be guided to the recovery unit via the recovery flow passage 67.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases. Accordingly, in a case where the downstream heaters 53 heat the pure water during discharge stoppage state, a state where the temperatures of the downstream heaters 53 are stable is maintained. Further, the pure water is supplied to the downstream heaters 53 during discharge stoppage state and thus the consumption amount of the chemical liquid decreases.

Figure 7:
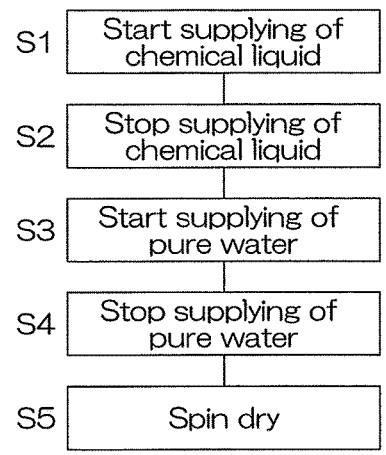
FIG. 7 is a process flowchart for describing an example of substrate processing executed by the substrate processing apparatus.

FIG. 7 is a process flowchart for describing an example of processing of the substrate W executed by the substrate processing apparatus 1. The respective operations described below are executed by the controller 3 controlling the substrate processing apparatus 1. FIG. 3 and FIG. 4 shall be referenced in the following description. FIG. 7 shall be referenced where suitable.

When the substrate W is to be processed by the processing unit 2, the substrate W is carried into the interior of the chamber 7 by a hand (not shown) of the transfer robot in a state where the plurality of nozzles 26 are retracted from above the spin chuck 11 and the splash guard 17 is positioned at the lower position. The substrate W is thereby placed, in a state where the front surface is faced up, on the plurality of chuck pins 13. Thereafter, the hand of the transfer robot is retracted from the interior of the chamber 7 and the carry-in/carry-out port 8a of the chamber 7 is closed by the shutter 9.

After the substrate W has been placed on the plurality of chuck pins 13, the plurality of chuck pins 13 are pressed against peripheral edge portions of the substrate W and the substrate W is gripped by the plurality of chuck pins 13. Also, the guard raising/lowering unit 18 moves the splash guard 17 from the lower position to the upper position. The upper end of the splash guard 17 is thereby disposed higher than the substrate W. Thereafter, the spin motor 14 is driven to start rotation of the substrate W. The substrate W is thereby rotated at a predetermined liquid processing speed (of, for example, several hundred rpm).

Thereafter, the nozzle moving unit 24 moves the plurality of nozzles 26 from the standby position to the processing position. The plurality of discharge ports 34 are thereby overlapped with the substrate W in a plan view. Thereafter, the plurality of discharge valves 51, etc., are controlled and the chemical liquids are discharged at the same time from the plurality of nozzles 26 (step S1 of FIG. 7). The plurality of nozzles 26 discharge the chemical liquids in a state where the nozzle moving unit 24 keeps the plurality of nozzles 26 still. When a predetermined time elapses from the opening of the plurality of discharge valves 51, the discharges of chemical liquids from the plurality of nozzles 26 are stopped at the same time (step S2 of FIG. 7). Thereafter, the nozzle moving unit 24 moves the plurality of nozzles 26 from the processing position to the standby position.

The chemical liquids discharged from the plurality of nozzles 26 land on the upper surface of the rotating substrate W and thereafter flow outward (in the direction away from the rotational axis A1) along the upper surface of the substrate W due to a centrifugal force. The chemical liquid that reaches the upper surface peripheral edge portion of the substrate W is scattered to a periphery of the substrate W and received by an inner peripheral surface of the splash guard 17. The chemical liquid is thereby supplied to the entire upper surface of the substrate W and a liquid film of the chemical liquid that covers the entire upper surface of the substrate W is formed on the substrate W. The entire upper surface of the substrate W is thereby processed by the chemical liquid.

After the discharges of chemical liquids from the plurality of nozzles 26 have been stopped, the rinse liquid valve 23 is opened and discharge of the rinse liquid (pure water) from the rinse liquid nozzle 21 is started (step S3 of FIG. 7). The chemical liquid on the substrate W is thereby rinsed off by the rinse liquid and a liquid film of the rinse liquid that covers the entire upper surface of the substrate W is formed. When a predetermined time elapses from the opening of the rinse liquid valve 23, the rinse liquid valve 23 is closed and the discharge of the rinse liquid from the rinse liquid nozzle 21 is stopped (step S4 of FIG. 7).

After the discharge of the rinse liquid from the rinse liquid nozzle 21 has been stopped, the substrate W is accelerated in the rotational direction by the spin motor 14 and the substrate W is rotated at a drying speed (of, for example, several thousand rpm) higher than the liquid processing speed (step S5 of FIG. 7). The rinse liquid attached to the substrate W is thereby spun off to the periphery of the substrate W and the substrate W is dried. When a predetermined time elapses from the start of high speed rotation of the substrate W, the rotation of the spin motor 14 and the substrate W is stopped.

After the rotation of the substrate W has been stopped, the guard raising/lowering unit 18 moves the splash guard 17 from the upper position to the lower position. Further, the holding of the substrate W by the plurality of chuck pins 13 is released. The transfer robot makes its hand enter the interior of the chamber 7 in the state where the plurality of nozzles 26 are retracted from above the spin chuck 11 and the splash guard 17 is positioned at the lower position. Thereafter, the transfer robot uses the hand to take the substrate W on the spin chuck 11 and carries out the substrate W from the chamber 7.

Figure 8:
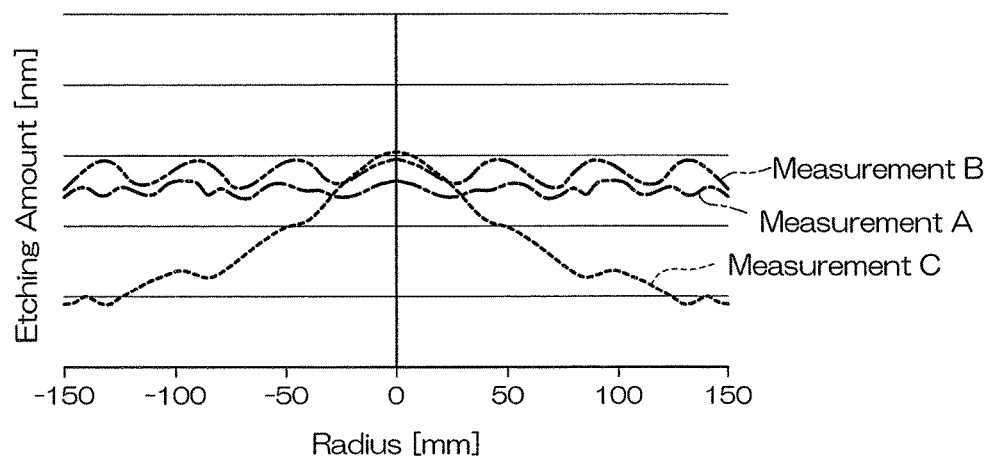
FIG. 8 is a graph of etching amount distributions of substrates.

FIG. 8 is a graph of etching amount distributions of substrates W.

The processing conditions of the substrates W of measurement A to measurement C shown in FIG. 8 are the same with the exception of the nozzles that discharge the chemical liquids.

The measurement A indicates the etching amount distribution when a substrate W is etched by making a plurality of discharge ports 34 (ten discharge ports 34) discharge the chemical liquids while keeping still the plurality of nozzles 26.

The measurement B indicates the etching amount distribution when a substrate W is etched by making a plurality of discharge ports 34 (four discharge ports 34) discharge the chemical liquids while keeping still the plurality of nozzles 26 from which all nozzle heads 33 have been removed. That is, the measurement B indicates the etching amount distribution when the four discharge ports 34 (corresponding to the first discharge port 34A) respectively disposed in the four main nozzle bodies 27 are made to discharge the chemical liquids.

The measurement C indicates the etching amount distribution when just a single discharge port 34 is made to discharge the chemical liquid and the liquid landing position of the chemical liquid is fixed at the upper surface central portion of the substrate W.

With the measurement C, the etching amount decreases with distance away from the central portion of the substrate W and the etching amount distribution exhibits a peak-shaped curve. That is, the etching amount is greatest at the liquid landing position of the chemical liquid and decreases with distance away from the liquid landing position. On the other hand, with the measurement A and the measurement B, the etching amounts at positions besides the central portion of the substrate W are increased and etching uniformity is greatly improved in comparison to the measurement C.

With the measurement B, seven peaks are formed. The apex of the central peak is at a position corresponding to the innermost liquid landing position and the apexes of the two peaks at outer sides thereof are at positions corresponding to the second liquid landing position from the inner side. The positions of the apexes of the two peaks further to the outer sides are positions corresponding to the third liquid landing position from the inner side, and the positions of the two outermost peaks are positions corresponding to the fourth liquid landing position from the inner side.

With the measurement A, a plurality of peaks corresponding to the plurality of liquid landing positions are formed similarly to the measurement B. Whereas with the measurement B, the number of discharge ports 34 is four, with the measurement A, the number of discharge ports 34 is ten and therefore the number of peaks is increased. Further in comparison to the measurement B, the curve indicating the etching amount distribution is closer to a straight line extending in a right/left direction (a straight line of fixed etching amount) and the etching uniformity is improved.

As described above, with the present preferred embodiment, the supply flow passage 47 that guides the processing liquid is branched into the plurality of upstream flow passages 48. The number of discharge ports 34 can thereby be increased. Further, the branching upstream flow passages branching into the plurality of downstream flow passages 52 are included in the plurality of upstream flow passages 48 and the number of discharge ports 34 can thus be increased further.

The processing liquid flowing through the supply flow passage 47 is supplied to the discharge ports 34 from the upstream flow passages 48 or the downstream flow passages 52 and discharged toward the upper surface of the substrate W that rotates around the rotational axis A1. The plurality of discharge ports 34 are respectively disposed at the plurality of positions differing in distance from the rotational axis A1. Temperature uniformity of the processing liquid on the substrate W can thus be increased in comparison to a case where the processing liquid is discharged from just a single discharge port 34. The processing uniformity can thereby be increased while reducing the consumption amount of the processing liquid.

Also with the present preferred embodiment, during discharge stoppage state, the liquid is supplied to the upstream flow passages 48 and heated by the downstream heaters 53. The liquid heated by the downstream heaters 53 flows to the return flow passage 54 from the upstream flow passages 48 without being discharged from the plurality of discharge ports 34. Thus, a state where the temperatures of the downstream heaters 53 are stable is maintained even during discharge stoppage. The discharge of the processing liquid can thus be restarted immediately.

Also with the present preferred embodiment, the first chemical liquid and the second chemical liquid respectively stored in the first chemical liquid tank 41 and the second chemical liquid tank 61 are supplied to the supply flow passage 47. In a case where liquid including the first chemical liquid and the second chemical liquid is heated by the downstream heater 53 during discharge stoppage state, since this liquid cannot be returned to the first chemical liquid tank 41 and the second chemical liquid tank 61, the consumption amount of the first chemical liquid and the second chemical liquid increases. With the present preferred embodiment, during discharge stoppage state, the pure water is supplied to the upstream flow passages 48 and heated by the downstream heaters 53. Thus, a state where the temperatures of the downstream heaters 53 are stable is maintained while reducing the consumption amount of the chemical liquid.

Also with the present preferred embodiment, since the processing liquid that has passed through the downstream heaters 53 during discharge stoppage can be returned to the recovery unit, a state where the temperatures of the downstream heaters 53 are stable is maintained while reducing the consumption amount of the processing liquid. Further, the processing liquid that has passed through the downstream heaters 53 during discharge stoppage also can be expelled without being returned to the recovery unit. For example, in a case where two types of liquids respectively stored in the first chemical liquid tank 41 and the second chemical liquid tank 61 are supplied to the supply flow passage 47, since the processing liquid contains the two types of liquids, this processing liquid cannot be returned to the first chemical liquid tank 41 and the second chemical liquid tank 61. With the present preferred embodiment, any one of the recovery and the drainage can be selected and thus a state where the temperatures of the downstream heaters 53 are stable is maintained even in such a case.

Also with the present preferred embodiment, the upstream ends of the plurality of downstream flow passages 52 are disposed inside the chamber 7. The branching upstream flow passages branch into the plurality of downstream flow passages 52 inside the chamber 7. Each downstream flow passage 52 can thus be reduced in length (length in a direction in which the liquid flows) in comparison to a case where the branching upstream flow passages are branched outside the chamber 7. Temperature decrease of the processing liquid due to heat transfer from the processing liquid to each downstream flow passage 52 can thereby be suppressed.

Also with the present preferred embodiment, the upstream ends of the plurality of upstream flow passages 48 are disposed inside the fluid box 5. The supply flow passage 47 branches into the plurality of upstream flow passages 48 inside the fluid box 5. Each upstream flow passage 48 can thus be reduced in length (length in a direction in which the liquid flows) in comparison to a case where the supply flow passage 47 branches into the plurality of upstream flow passages 48 at a position further upstream than the fluid box 5. Temperature decrease of the processing liquid due to heat transfer from the processing liquid to each upstream flow passage 48 can thereby be suppressed.

Also with the present preferred embodiment, the processing liquids that have been heated at the downstream temperatures higher than the upstream temperature by the downstream heaters 53 are supplied to the discharge ports 34, besides the innermost discharge port (the first discharge port 34A), from the upstream flow passages 48 besides the innermost upstream flow passage (the first upstream flow passage 48A) and are discharged from the discharge ports 34. That is, whereas the processing liquid of the upstream temperature is discharged from the innermost discharge port, the processing liquid of higher temperature than the upstream temperature is discharged from each of the discharge ports 34 positioned further to the outer side than the innermost discharge port.

The temperatures of the processing liquids supplied to the upper surface of the substrate W thus increase stepwise with distance away from the rotational axis A1 and the temperature uniformity can thus be increased in comparison to a case where the processing liquid of the same temperature is discharged from each discharge port 34. The processing uniformity can thereby be increased while reducing the consumption amount of the processing liquid.

Figure 9:
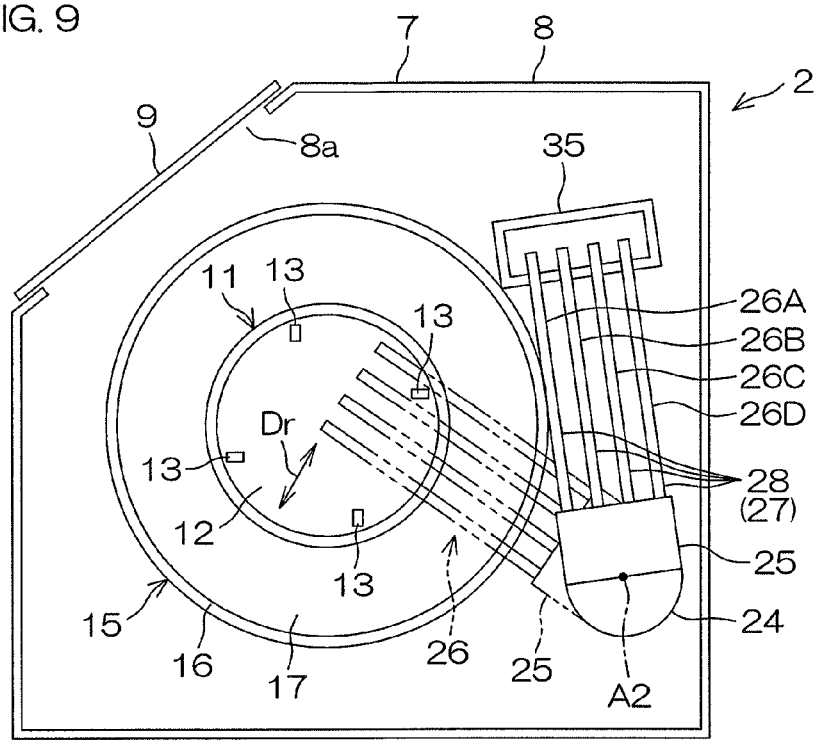
FIG. 9 is a schematic plan view of a plurality of nozzles according to a first modification example of the first preferred embodiment.
Figure 10A:
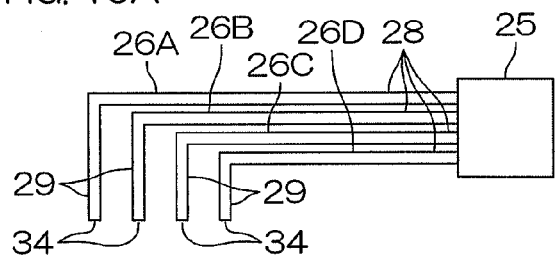
FIG. 10A and FIG. 10B are schematic views of a plurality of nozzles according to a second modification example of the first preferred embodiment, with FIG. 10A being a schematic front view of the plurality of nozzles and FIG. 10B being a schematic plan view of the plurality of nozzles.
Figure 10B:
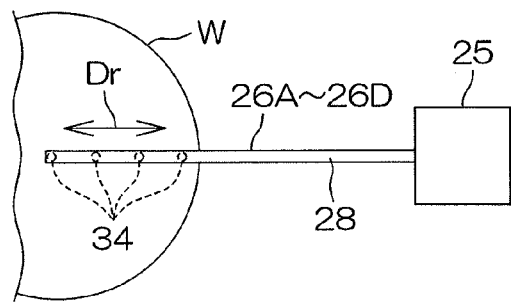

Also with the present preferred embodiment, the first discharge port 34A and the second discharge port 34B are aligned in a plan view in the radial direction Dr. When the plurality of nozzles 26 of the same length are aligned in a horizontal direction orthogonal to the longitudinal direction D1 so that the plurality of discharge ports 34 are aligned in a plan view in the radial direction Dr, an entirety of the plurality of nozzles 26 increases in width (see FIG. 9). When the plurality of nozzles 26 of different lengths are aligned in a vertical direction so that the plurality of discharge ports 34 are aligned in a plan view in the radial direction Dr, the entirety of the plurality of nozzles 26 increases in height (see FIG. 10A and FIG. 10B).

On the other hand, with the present preferred embodiment, the plurality of arm portions 28 are aligned in the horizontal alignment direction D2 orthogonal to the longitudinal direction D1. Further, the tips 28a of the plurality of arm portions 28 are shifted in the longitudinal direction D1 such that, in regard to the longitudinal direction D1, the tips 28a of the plurality of arm portions 28 are aligned in the order of the first nozzle 26A to the fourth nozzle 26D from the rotational axis A1 side (see FIG. 4). The plurality of discharge ports 34 can thereby be aligned in the radial direction Dr in a plan view while suppressing both the width and the height of the entirety of the plurality of nozzles 26.

The present invention is not restricted to the content of the preferred embodiment and various modifications are possible within the scope of the present invention.

For example, although with the preferred embodiment described above, the case where the number of the nozzles 26 is four was described, the number of the nozzles 26 may be two or three or may be five or more.

Although with the preferred embodiment, the case where a downstream heater 53 is not disposed at the first upstream flow passage 48A, while downstream heaters 53 are disposed at all upstream flow passages 48 besides the first upstream flow passage 48A was described, the downstream heaters 53 may be disposed at all upstream flow passages 48 including the first upstream flow passage 48A. The same applies to the return passages 54.

Although with the preferred embodiment, the case where a nozzle head 33 is not disposed at the first nozzle 26A while nozzle heads 33 are mounted on all nozzles 26 besides the first nozzle 26A was described, the nozzle heads 33 may be disposed at all nozzles 26 including the first nozzle 26A. Oppositely, the nozzle heads 33 do not have to be disposed at all of the nozzles 26.

Although with the preferred embodiment, the case where three downstream flow passages 52 and three discharge ports 34 are defined in a single nozzle head 33 was described, the number of downstream flow passages 52 and discharge ports 34 defined in a single nozzle head 33 may be two or may be four or more.

Although with the preferred embodiment, the case where each of the branching upstream flow passages (the upstream flow passages 48 besides the first upstream flow passage 48A) branches into a plurality of the downstream flow passages 52 within the chamber 7 was described, the branching upstream flow passages may branch outside the chamber 7 instead.

Although with the preferred embodiment, the case where the plurality of discharge ports 34 are aligned in the radial direction Dr in a plan view was described, as long as the plurality of discharge ports 34 are respectively disposed at positions differing in distance from the rotational axis A1, the plurality of discharge ports 34 do not have to be aligned in the radial direction Dr in a plan view.

Although with the preferred embodiment, the case where the plurality of nozzles 26 are made to discharge the chemical liquids while keeping the plurality of nozzles 26 still was described, the plurality of nozzles 26 may be made to discharge the chemical liquids while making the plurality of nozzles 26 pivot around the nozzle pivoting axis A2.

Although with the preferred embodiment, the case where all of the discharge valves 51 are opened at the same time and all of the discharge valves 51 are closed at the same time was described, the controller 3 may control the plurality of discharge valves 51 so that the time during which a discharge port 34 at an outer side is discharging the processing liquid is longer than the time during which a discharge port 34 at an inner side is discharging the processing liquid.

Although with the preferred embodiment, the case where the downstream heater 53 heats the pure water during discharge stoppage state was described, the downstream heater 53 may heat the sulfuric acid or the hydrogen peroxide water during discharge stoppage state. In this case, the chemical liquid (the sulfuric acid or the hydrogen peroxide water) heated by the downstream heater 53 during discharge stoppage state may be returned to the original tank (the chemical liquid tank 41 or the second chemical liquid tank 61) serving as the recovery unit in order to reduce the consumption amount of the sulfuric acid or the hydrogen peroxide water. Further, the chemical liquid cooled by the cooler may be returned to the original tank.

Although with the preferred embodiment, the case where two types of chemical liquids (the sulfuric acid and the hydrogen peroxide water) is supplied to the supply flow passage 47 and the plurality of discharge ports 34 discharge the mixed chemical liquid containing the two types of chemical liquids was described, one type of chemical liquid may be supplied to the supply flow passage 47 and discharged from the plurality of discharge ports 34.

Although with the preferred embodiment, the case where both of the recovery flow passage 67 and the drain flow passage 69 are connected to the return passages 54 was described, only one of the recovery flow passage 67 and the drain flow passage 69 may be connected to the return passages 54.

The controller 3 may control the temperatures of the processing liquids supplied to respective portions of the front surface of the substrate W in accordance with a thickness of a thin film before processing to make uniform the thickness of the thin film after processing.

Figure 11:
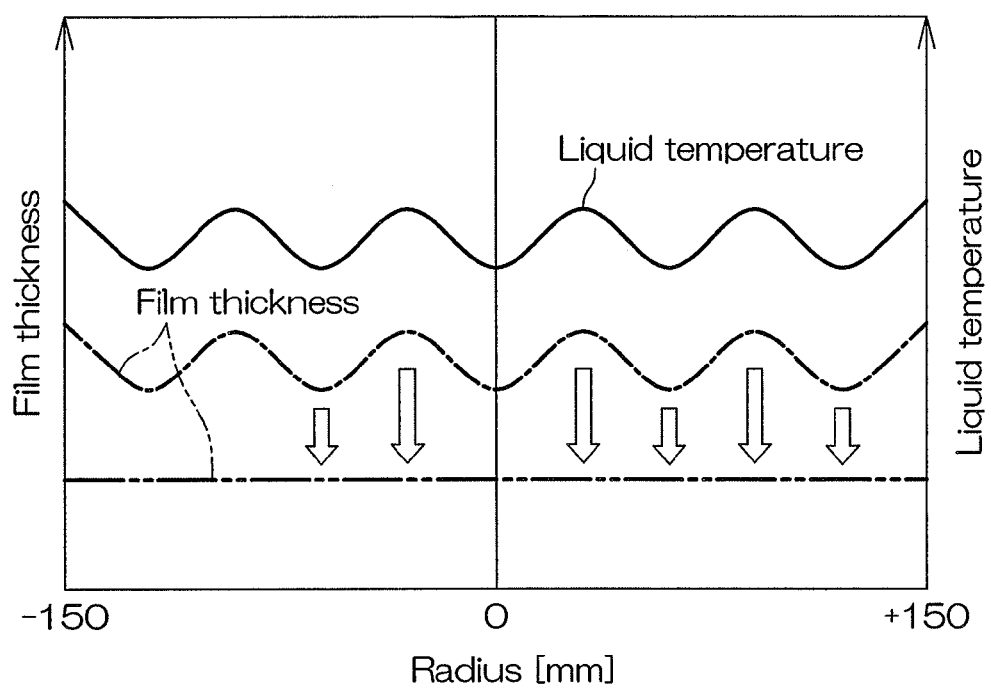
FIG. 11 is a graph showing a conceptual image of a thickness of a thin film before and after processing and a temperature of a processing liquid supplied to a substrate.

FIG. 11 is a graph showing a conceptual image of a thickness of a thin film before and after processing and a temperature of a processing liquid supplied to a substrate W. An alternate long and short dashes line in FIG. 11 indicates the film thickness before processing and an alternate long and two short dashes line in FIG. 11 indicates the film thickness after processing. A solid line in FIG. 11 indicates the temperatures of the processing liquids supplied to the substrate W. The abscissa axis of FIG. 11 indicates the radius of the substrate W. The film thickness before processing may be input into the substrate processing apparatus 1 from an apparatus (for example, a host computer) other than the substrate processing apparatus 1 or may be measured by a measuring instrument provided in the substrate processing apparatus 1.

With the example shown in FIG. 11, the controller 3 may control the substrate processing apparatus 1 so that the temperatures of the processing liquids vary similarly to the film thickness before processing. Specifically, the controller 3 may control the plurality of downstream heaters 53 so that the temperatures of the processing liquids in the plurality of upstream flow passages 48 are temperatures that are in accordance with the film thickness before processing.

In this case, processing liquid of relatively high temperature is supplied to a position at which the film thickness before processing is relatively large and processing liquid of relatively low temperature is supplied to a position at which the film thickness before processing is relatively small. The etching amount of the thin film formed on the front surface of the substrate W increases relatively at a position at which processing liquid of high temperature is supplied and decreases relatively at a position at which processing liquid of low temperature is supplied. The thin film is thus made uniform in thickness after processing.

Two or more of any of the arrangements described above may be combined. Two or more of any of the processes described above may be combined.

Second Preferred Embodiment

A second preferred embodiment of the present invention shall now be described. Components equivalent to the respective portions described above shall be provided with the same reference symbols as in FIG. 1, etc., and description thereof shall be omitted.

As shown in FIG. 12 and FIG. 13, the processing liquid supplying system includes the chemical liquid tank 41 storing the chemical liquid, the chemical liquid flow passage 42 guiding the chemical liquid fed from the chemical liquid tank 41, the upstream heater 43 heating the chemical liquid flowing inside the chemical liquid flow passage 42 at the upstream temperature higher than room temperature (for example, of 20 to 30° C.) to adjust the temperature of the chemical liquid inside the chemical liquid tank 41, the pump 44 feeding the chemical liquid inside the chemical liquid tank 41 to the chemical liquid flow passage 42, and the circulation flow passage 40 returning the chemical liquid inside the chemical liquid flow passage 42 to the chemical liquid tank 41.

The processing liquid supplying system includes the supply valve 45 that opens and closes the chemical liquid flow passage 42, the circulation valve 46 that opens and closes the circulation flow passage 40, and the supply flow passage 47 connected to the chemical liquid flow passage 42. An upstream switching unit includes the liquid supply valve 45.

The processing liquid supplying system includes the plurality of upstream flow passages 48 guiding the liquid supplied from the supply flow passage 47 to the plurality of discharge ports 34, a plurality of flowmeters 49 detecting flow rates of the liquids flowing inside the plurality of upstream flow passages 48, a plurality of flow control valves 50 that change the flow rates of the liquids flowing inside the plurality of upstream flow passages 48, and a plurality of discharge valves 51 respectively opening and closing the plurality of upstream flow passages 48. Although unillustrated, each flow control valve 50 includes a main valve body that opens and closes the flow passage and an actuator that changes an open degree of the main valve body. The actuator may be a pneumatic actuator or an electric actuator or an actuator besides these.

The processing liquid supplying system includes the plurality of downstream flow passages 52 that guide the liquids supplied from the upstream flow passages 48 to the plurality of discharge ports 34. The downstream end of each of the upstream flow passages 48 besides the first upstream flow passage 48A branches into a plurality of downstream flow passage 52. That is, each of the upstream flow passages 48 besides the first upstream flow passage 48A is a branching upstream flow passage that branches into a plurality of downstream flow passage 52.

FIG. 12 and FIG. 13 show an example where each branching upstream flow passage branches into two downstream flow passages 52. FIG. 5 shows an example where each branching upstream flow passage branches into three downstream flow passages 52. The three downstream flow passages 52 branching from the second upstream flow passage 48B are respectively connected to the three discharge ports 34 (the inner discharge port, middle discharge port, and the outer discharge port) disposed in the same nozzle head 33. The same as the second upstream flow passage 48B applies to the third upstream flow passage 48C and the fourth upstream flow passage 48D. The first upstream flow passage 48A is connected to the first discharge port 34A disposed in the first nozzle 26A.

The processing liquid supplying system includes a plurality of downstream heaters 53 that heat the liquids flowing inside the plurality of upstream flow passages 48 besides the first upstream flow passage 48A at downstream temperatures higher than the upstream temperature. The processing liquid supplying system further includes a plurality of return flow passages 54, respectively connected to the plurality of upstream flow passages 48 besides the first upstream flow passage 48A at positions further downstream than the plurality of downstream heaters 53, and a plurality of return valves 55, respectively opening and closing the plurality of return flow passages 54. A downstream switching unit includes the plurality of discharge valves 51 and the plurality of return valves 55.

The processing liquid supplying system includes the cooler 56 cooling the chemical liquids supplied from the plurality of return flow passages 54 and the tank recovery flow passage 57 guiding the chemical liquid from the cooler 56 to the chemical liquid tank 41. The chemical liquids supplied from the plurality of return flow passage 54 to the cooler 56 are made closer in temperature to the upstream temperature by the cooler 56 and thereafter guided via the tank recovery flow passage 57 to the chemical liquid tank 41. The cooler 56 may be a water cooled unit or an air cooled unit or may be a cooling unit other than these.

The processing liquid supplying system in a discharging state in which the chemical liquids are discharged from the plurality of discharge ports 34 shall now be described with reference to FIG. 12. In FIG. 12, an open valve is indicated in black and a closed valve is indicated in white.

The chemical liquid inside the chemical liquid tank 41 is fed to the chemical liquid flow passage 42 by the pump 44. The chemical liquid fed by the pump 44 is heated by the upstream heater 43 and thereafter flows from the chemical liquid flow passage 42 to the supply flow passage 47 and flows to the plurality of upstream flow passages 48 from the supply flow passage 47. The chemical liquids supplied to the plurality of branching upstream flow passages, i.e. the plurality of upstream flow passages 48 besides the first upstream flow passage 48A are heated by the downstream heaters 53 and thereafter flow to the plurality of downstream flow passage 52.

The chemical liquid inside the first upstream flow passage 48A is supplied to the single first discharge port 34A disposed in the first nozzle 26A. The chemical liquid inside the second upstream flow passage 48B is supplied via the plurality of downstream flow passages 52 to the plurality of second discharge ports 34B disposed in the second nozzle 26B. The same as the second upstream flow passage 48B applies to the third upstream flow passage 48C and the fourth upstream flow passage 48D. The chemical liquids are thereby discharged from all discharge ports 34.

The heating temperatures (downstream temperatures) of the processing liquids by the downstream heaters 53 are higher than the heating temperature (upstream temperature) of the processing liquid by the upstream heater 43. The second to fourth downstream temperatures increase in the order of the second to the fourth downstream temperatures. The first discharge port 34A discharges the chemical liquid of the upstream temperature. Each of the second discharge ports 34B discharges the chemical liquid of the second downstream temperature. Each of the third discharge ports 34C discharges the chemical liquid of the third downstream temperature. Each of the fourth discharge ports 34D discharges the chemical liquid of the fourth downstream temperature. The temperatures of the chemical liquids discharged from the plurality of discharge ports 34 thus increase stepwise with distance away from the rotational axis A1.

The processing liquid supplying system in a discharge stoppage state in which the discharges of chemical liquids from the plurality of discharge ports 34 are stopped shall now be described with reference to FIG. 13. In FIG. 13, an open valve is indicated in black and a closed valve is indicated in white.

The chemical liquid inside the chemical liquid tank 41 is fed to the chemical liquid flow passage 42 by the pump 44. A portion of the chemical liquid fed by the pump 44 is heated by the upstream heater 43 and thereafter returned to the chemical liquid tank 41 via the circulation flow passage 40. The remaining portion of the chemical liquid fed by the pump 44 flows from the chemical liquid flow passage 42 to the supply flow passage 47 and flows from the supply flow passage 47 to the plurality of upstream flow passages 48 besides the first upstream flow passage 48A.

The chemical liquid inside the second upstream flow passage 48 is heated by the downstream heater 53 associated with the second upstream flow passage 48B and thereafter flows via the return flow passage 54 to the cooler 56. The same as the second upstream flow passage 48B applies to the third upstream flow passage 48C and the fourth upstream flow passage 48D. The chemical liquids supplied to the cooler 56 are cooled by the cooler 56 and return to the chemical liquid tank 41 via the tank recovery flow passage 57. All of the chemical liquid fed to the chemical liquid flow passage 42 by the pump 44 is thereby returned to the chemical liquid tank 41.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases.

As described above, even during discharge stoppage, the chemical liquids are made to continue to flow to the downstream heaters 53 and the downstream heaters 53 are made to heat the chemical liquids. A state where the temperatures of the downstream heaters 53 are stable can thus be maintained. Further, the chemical liquids heated by the downstream heaters 53 are returned to the chemical liquid tank 41 and the consumption amount of the chemical liquid can thus be reduced.

In a case where chemical liquid of high temperature is supplied to the processing unit 2 from the chemical liquid tank 41, in order to prevent the lowering of the temperature of the chemical liquid due to heat loss through piping, a flow passage length from the chemical liquid tank 41 to the processing unit 2 may be shortened by locating the chemical liquid tank 41 at a position near the processing unit 2.

However, if the chemical liquid tank 41 is close to the processing unit 2, the chemical liquid, heated by the downstream heater 53 during discharge stoppage state, returns to the chemical liquid tank 41 in a state in which the temperature of the chemical liquid is not lowered sufficiently. When the temperature of the chemical liquid in the chemical liquid tank 41 exceeds the preset temperature, it is necessary to wait for a long time until the temperature of the liquid falls below the preset temperature naturally.

With the preferred embodiment, the controller 3 decreases the opening degree of the return flow control unit including the plurality of flow control valves 50 as compared to during discharge state. The opening degree of the flow control valve 50 during discharge stoppage state is smaller than the opening degree of the flow control valve 50 during discharge state. The total flow rate FR1 of the chemical liquid supplied to the plurality of upstream flow passages 48 from the supply flow passage 47 during discharge state is greater than the total flow rate FR2 of the chemical liquid supplied to the plurality of upstream flow passages 48 from the supply flow passage 47 during discharge stoppage state.

The controller 3 controls the downstream heater 53 so that the temperature of the heated liquid becomes the preset temperature (the downstream temperature). If the temperature of the liquid before heating is constant and the temperature of the liquid after heating is constant, a heat amount applied to the liquid by the downstream heater 5 decreases as the flow rate decreases. Thus, the total amount of heat transferred to the chemical liquid in the chemical liquid tank 41 from the downstream heater 5 via the chemical liquid as the medium can be reduced by decreasing the opening degrees of the flow control valves 50 during discharge stoppage state. Moreover, the chemical liquid returning to the chemical liquid tank 41 via the return flow passages 54 is cooled by the cooler 56 to a temperature close to the upstream temperature (for example, a temperature equal to or lower than the upstream temperature).

In this way, since the flow rate of the chemical liquid returning to the chemical liquid tank 41 via the return flow passages 54 decreases and the cooler 56 cools this chemical liquid, the chemical liquid in the chemical liquid tank 4 is maintained at or close to the preset temperature even when the chemical liquid heated by the downstream heater 53 is recovered to the chemical liquid tank 41. Thus, the chemical liquid tank 41 can be located close to the processing unit 2 and the lowering of the temperature of the chemical liquid due to heat loss through piping is reduced.

An example of processing of the substrate W executed by the substrate processing apparatus 1 according to the second preferred embodiment is the same as the example of processing of the substrate W executed by the substrate processing apparatus 1 according to the first preferred embodiment. Etching amount distributions of the substrates W according to the second preferred embodiment is the same as the etching amount distributions of the substrates W according to the first preferred embodiment.

With the second preferred embodiment, the following operations and effects are obtained in addition to the operations and effects according to the first preferred embodiment.

With the preferred embodiment, during discharge stoppage, the chemical liquids are supplied to the upstream flow passages 48 and heated by the downstream heaters 53. A state where the temperatures of the downstream heaters 53 are stable can thus be maintained even during discharge stoppage. The discharge of the chemical liquid can thus be restarted immediately. Further, the chemical liquid heated by the downstream heaters 53 returns to the chemical liquid tank 41 via the return flow passage 54 during discharge stoppage and thus the consumption amount of the chemical liquid decreases. Furthermore, a return flow control unit including the plurality of flow control valves 50 decreases the flow rate of the chemical liquid returned to the chemical liquid tank 41 from the return flow passage 54, and thus a heat amount applied to the chemical liquid in the chemical liquid tank 41 can be reduced and variation of temperature of liquid can be suppressed.

Also with the present preferred embodiment, not only during discharge state, but also during discharge stoppage state, the chemical liquid is supplied to the downstream heaters 53 and heated by the downstream heaters 53. The chemical liquid heated by the downstream heater 53 during discharge stoppage state flows to the return flow passage 54 from the upstream passage 48. The chemical liquid flowing through the return flow passage 54 toward the chemical liquid tank 41 is cooled by the cooler 56. Thus, the chemical liquid that has cooled by the cooler 56 returns to the chemical liquid tank 41. As a result, the variation of the temperature of the chemical liquid in the chemical liquid tank 41 can be further suppressed.

The present invention is not restricted to the content of the preferred embodiment and various modifications are possible within the scope of the present invention.

For example, although with the preferred embodiment, the case where the chemical liquid flowing through each of the return flow passages 54 toward the chemical tank 41 is cooled by the cooler 56 was described, the cooler 56 may be omitted if the chemical liquid in the chemical liquid tank 41 is maintained close to the preset temperature by adjusting the flow rate of the chemical liquid returning to the chemical liquid tank 41 via the return flow passages 54. That is, the chemical liquid flowing through the return flow passages 54 can be returned to the chemical liquid tank 41 without being cooled by the cooler 56.

Although with the preferred embodiment, the case where the chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

Two or more of any of the arrangements described above may be combined. Two or more of any of the processes described above may be combined.

A feature of a certain preferred embodiment may be added to another preferred embodiment.

The present application corresponds to Japanese Patent Application Nos. 2015-035517 and 2015-035518 respectively filed on Feb. 25, 2015, and Feb. 25, 2015, 2015 in the Japan Patent Office, and the entire disclosures of these applications are incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus comprising:
   a substrate holder rotating a substrate around a vertical rotational axis passing through a central portion of the substrate while holding the substrate horizontally; and
   a processing liquid supplying system including an upstream heater, a supply flow passage, a plurality of upstream flow passages, a plurality of discharge ports, a plurality of return flow passages, a plurality of downstream heaters, and downstream switching valves, and supplying a processing liquid to the substrate held by the substrate holder; and wherein the upstream heater heats a liquid, the supply flow passage guides the liquid heated by the upstream heater toward the plurality of upstream flow passages, the plurality of upstream flow passages branch from the supply flow passage and guide the liquid supplied from the supply flow passage toward the plurality of discharge ports, the plurality of discharge ports include a main discharge port discharging the processing liquid toward an upper surface central portion of the substrate and a plurality of auxiliary discharge ports discharging the processing liquid toward a plurality of positions within an upper surface of the substrate, the plurality of positions being away from the upper surface central portion and differing in distance from the rotational axis, and are respectively disposed at a plurality of positions differing in distance from the rotational axis, and respectively discharge the processing liquid supplied via the plurality of upstream flow passages toward the upper surface of the substrate held by the substrate holder, the plurality of upstream flow passages include a main upstream flow passage connected to the main discharge port and a plurality of auxiliary upstream flow passages connected to the plurality of auxiliary discharge ports, the plurality of return flow passages are respectively connected to the plurality of auxiliary upstream flow passages at positions further upstream than the plurality of auxiliary discharge ports, the plurality of downstream heaters are respectively connected to the plurality of auxiliary upstream flow passages at positions further upstream than a connection position between the return flow passage and the auxiliary upstream flow passage, and heat the liquid flowing through the plurality of auxiliary upstream flow passages, and the downstream switching valves are switched into any one of a plurality of states including a discharge state in which the liquid, supplied to the plurality of upstream flow passages from the supply flow passage, is supplied to the plurality of discharge ports, and a discharge stoppage state in which the liquid, supplied to the plurality of upstream flow passages from the supply flow passage, is supplied to the plurality of return flow passages.

2. The substrate processing apparatus according to claim 1, wherein the processing liquid supplying system further includes a first chemical liquid flow passage, a second chemical liquid flow passage, a pure water flow passage, and upstream switching valves, the first chemical liquid flow passage supplies the supply flow passage with a first chemical liquid, the second chemical liquid flow passage supplies the supply flow passage with a second chemical liquid, the pure water flow passage supplies the supply flow passage with a pure water, and the upstream switching valves are switched into any one of a plurality of states including a discharge state in which the first chemical liquid and the second chemical liquid are supplied to the supply flow passage, and a discharge stoppage state in which the pure water is supplied to the supply flow passage and the supplying of the first chemical liquid and the second chemical liquid into the supply flow passage is stopped.

3. The substrate processing apparatus according to claim 1, wherein the processing liquid supplying system further includes a drain flow passage and recovery/drainage switching valves, the drain flow passage is connected to the plurality of return flow passages, and the recovery/drainage switching valves are switched into any one of a plurality of states including a recovery state in which the liquid flowing through the plurality of return flow passages is guided to a recovery flow passage, and a drainage state in which the liquid flowing through the plurality of return flow passages is guided to the drain flow passage.

4. The substrate processing apparatus according to claim 1, wherein the processing liquid supplying system further includes a plurality of downstream flow passages, and each of the plurality of auxiliary upstream flow passages is a branching upstream flow passage that branches into a plurality of the downstream flow passages and each auxiliary discharge port is respectively provided according to each downstream flow passage.

5. The substrate processing apparatus according to claim 4, wherein the substrate processing apparatus further comprises a chamber housing the substrate held by the substrate holder, and the branching upstream flow passages branch into the plurality of downstream flow passages inside the chamber.

6. The substrate processing apparatus according to claim 1, wherein the upstream heater heats the liquid to be supplied to the supply flow passage at an upstream temperature, and the plurality of downstream heaters heat the liquid flowing through the plurality of auxiliary upstream flow passages at a downstream temperature higher than the upstream temperature.

7. The substrate processing apparatus according to claim 1, wherein the processing liquid supplying system further includes a first nozzle and a second nozzle, the plurality of discharge ports include a first discharge port, disposed in the first nozzle, and a second discharge port, disposed in the second nozzle, and are aligned in a radial direction orthogonal to the rotational axis in a plan view, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

8. A substrate processing apparatus comprising:
a substrate holder rotating a substrate around a vertical rotational axis passing through a central portion of the substrate while holding the substrate horizontally; and
a processing liquid supplying system including a tank, an upstream heater, a supply flow passage, a plurality of upstream flow passages, a plurality of discharge ports, a plurality of return flow passages, a plurality of downstream heaters, downstream switching valves, and a plurality of return flow control valves, and supplying a processing liquid to the substrate held by the substrate holder; and
wherein the tank stores the processing liquid to be supplied to the supply flow passage,
the upstream heater adjusts a temperature of the processing liquid inside the tank by heating the processing liquid,
the supply flow passage guides the processing liquid toward the plurality of upstream flow passages,
the plurality of upstream flow passages branch from the supply flow passage and guide the processing liquid supplied from the supply flow passage toward the plurality of discharge ports,
the plurality of discharge ports include a main discharge port discharging the processing liquid toward an upper surface central portion of the substrate and a plurality of auxiliary discharge ports discharging the processing liquid toward a plurality of positions within an upper surface of the substrate, the plurality of positions being away from the upper surface central portion and differing in distance from the rotational axis, and are respectively disposed at a plurality of positions differing in distance from the rotational axis, and respectively discharge the processing liquid supplied via the plurality of upstream flow passages toward the upper surface of the substrate held by the substrate holder,
the plurality of upstream flow passages include a main upstream flow passage connected to the main discharge port and a plurality of auxiliary upstream flow passages connected to the plurality of auxiliary discharge ports,
the plurality of return flow passages are respectively connected to the plurality of auxiliary upstream flow passages at positions further upstream than the plurality of auxiliary discharge ports, and guide the processing liquid supplied from the plurality of auxiliary upstream flow passages toward the tank,
the plurality of downstream heaters are respectively connected to the plurality of auxiliary upstream flow passages at positions further upstream than a connection position between the return flow passage and the auxiliary upstream flow passage, and heat the processing liquid flowing through the plurality of auxiliary upstream flow passages,
the downstream switching valves are switched into any one of a plurality of states including a discharge state in which the processing liquid, supplied to the plurality of upstream flow passages from the supply flow passage, is supplied to the plurality of discharge ports, and a discharge stoppage state in which the processing liquid, supplied to the plurality of upstream flow passages from the supply flow passage, is supplied to the plurality of return flow passages, and the plurality of return flow control valves are respectively connected to the plurality of upstream flow passages, and make a flow rate of the processing liquid supplied to the plurality of upstream flow passages from the supply flow passage during the discharge stoppage state smaller than a flow rate of the processing liquid supplied to the plurality of upstream flow passages from the supply flow passage during the discharge state.

9. The substrate processing apparatus according to claim 8, wherein
the processing liquid supplying system further includes a cooler that cools the processing liquid flowing through the plurality of return flow passages toward the tank.

10. The substrate processing apparatus according to claim 8, wherein
the processing liquid supplying system further includes a plurality of downstream flow passages, and
each of the plurality of auxiliary upstream flow passages is a branching upstream flow passage that branches into a plurality of the downstream flow passages and each auxiliary discharge port is respectively provided according to each downstream flow passage.

11. The substrate processing apparatus according to claim 10, wherein
the substrate processing apparatus further comprises a chamber housing the substrate held by the substrate holder, and
the branching upstream flow passages branch into the plurality of downstream flow passages inside the chamber.

12. The substrate processing apparatus according to claim 8, wherein
the upstream heater adjusts the temperature of the processing liquid inside the tank by heating the processing liquid at an upstream temperature, and
the plurality of downstream heaters heat the processing liquid flowing through the plurality of auxiliary upstream flow passages at a downstream temperature higher than the upstream temperature.

13. The substrate processing apparatus according to claim 8, wherein
the processing liquid supplying system further includes a first nozzle and a second nozzle,
the plurality of discharge ports include a first discharge port, disposed in the first nozzle, and a second discharge port, disposed in the second nozzle, and are aligned in a radial direction orthogonal to the rotational axis in a plan view,
the first nozzle includes a first arm portion extending in a horizontal longitudinal direction and a first tip portion extending downward from a tip of the first arm portion,
the second nozzle includes a second arm portion extending in the longitudinal direction and a second tip portion extending downward from a tip of the second arm portion,
the first arm portion and the second arm portion are aligned in a horizontal alignment direction orthogonal to the longitudinal direction, and
the tip of the first arm portion and the tip of the second arm portion are separated in the longitudinal direction in a plan view such that the tip of the first arm portion is positioned at the rotational axis side.

* * * * *